(12) United States Patent
Yeh et al.

(10) Patent No.: US 9,721,668 B2
(45) Date of Patent: Aug. 1, 2017

(54) 3D NON-VOLATILE MEMORY ARRAY WITH SUB-BLOCK ERASE ARCHITECTURE

(71) Applicant: MACRONIX INTERNATIONAL CO., LTD., Hsinchu (TW)

(72) Inventors: Teng-Hao Yeh, Hsinchu (TW); Kuo-Pin Chang, Miaoli (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 14/820,209

(22) Filed: Aug. 6, 2015

(65) Prior Publication Data

US 2017/0040061 A1 Feb. 9, 2017

(51) Int. Cl.
*G11C 16/14* (2006.01)
*G11C 16/04* (2006.01)
*G11C 16/08* (2006.01)
*H01L 27/24* (2006.01)

(52) U.S. Cl.
CPC .......... *G11C 16/14* (2013.01); *G11C 16/0483* (2013.01); *G11C 16/08* (2013.01); *H01L 27/24* (2013.01)

(58) Field of Classification Search
CPC ....................................................... G11C 16/14
USPC ..................................................... 365/185.11
See application file for complete search history.

(56) References Cited

U.S. PATENT DOCUMENTS

| | | | |
|---|---|---|---|
| 7,612,403 B2 | 11/2009 | Bhattacharyya | |
| 8,503,213 B2 | 8/2013 | Chen et al. | |
| 8,513,725 B2 | 8/2013 | Sakuma et al. | |
| 9,318,206 B2* | 4/2016 | Dong | G11C 16/14 |
| 2005/0018489 A1* | 1/2005 | Hosono | G11C 8/10 365/185.29 |
| 2006/0261401 A1 | 11/2006 | Bhattacharyya | |
| 2012/0051143 A1* | 3/2012 | Yoon | G11C 16/0483 365/185.22 |
| 2013/0083599 A1* | 4/2013 | Nam | G11C 16/14 365/185.11 |
| 2013/0163336 A1* | 6/2013 | Li | G11C 16/0483 365/185.17 |
| 2013/0163337 A1* | 6/2013 | Li | G11C 16/0483 365/185.17 |

(Continued)

OTHER PUBLICATIONS

Jung et al., "Three Dimensionally Stacked NAND Flash Memory Technology Using Stacking Single Crystal Si Layers on ILD and TANOS Structure for Beyond 30nm Node," IEEE IEDM 2006, Dec. 11-13, 4 pages.

(Continued)

*Primary Examiner* — Anthan Tran
*Assistant Examiner* — Mushfique Siddique
(74) *Attorney, Agent, or Firm* — Haynes Beffel & Wolfeld LLP

(57) ABSTRACT

A memory device has a divided reference line structure which supports sub-block erase in NAND memory including a plurality of blocks. Each block in the plurality of blocks is coupled to a set of Y reference lines, where Y is two or more. Each block in the plurality of blocks includes a single reference select line (RSL), which is operable to connect each sub-block in the block to a corresponding reference line in the set of Y reference lines. A control circuit can be included on the device which is configured for an erase operation to erase a selected sub-block in a selected block.

19 Claims, 14 Drawing Sheets

(56) References Cited

U.S. PATENT DOCUMENTS

| | | | |
|---|---|---|---|
| 2013/0279251 A1 | 10/2013 | Lee | |
| 2013/0279256 A1* | 10/2013 | Costa | G11C 5/02 365/185.17 |
| 2013/0279257 A1* | 10/2013 | Costa | G11C 5/02 365/185.17 |
| 2014/0043916 A1* | 2/2014 | Costa | G11C 16/14 365/185.25 |
| 2014/0063938 A1* | 3/2014 | Oh | H01L 27/11524 365/185.02 |
| 2014/0063947 A1* | 3/2014 | Ghodsi | G11C 16/0483 365/185.11 |
| 2014/0112075 A1* | 4/2014 | Dunga | G11C 16/12 365/185.17 |
| 2014/0133232 A1* | 5/2014 | Avila | G11C 16/0483 365/185.11 |
| 2014/0241060 A1* | 8/2014 | Ha | G11C 16/04 365/185.11 |
| 2014/0247671 A1* | 9/2014 | Ito | G11C 16/26 365/185.23 |
| 2015/0092494 A1* | 4/2015 | Rhie | G11C 16/16 365/185.12 |
| 2015/0221376 A1* | 8/2015 | Choi | G11C 16/10 365/185.11 |
| 2016/0049201 A1* | 2/2016 | Lue | G11C 16/0483 365/185.11 |
| 2016/0055918 A1* | 2/2016 | Kochar | G11C 16/3445 365/185.11 |
| 2016/0099047 A1* | 4/2016 | Lee | G11C 7/1039 365/185.03 |
| 2016/0267995 A1* | 9/2016 | Chang | G11C 16/14 |

OTHER PUBLICATIONS

Katsumata, et al., "Pipe-shaped BiCS Flash Memory With 16 Stacked Layers and Multi-Level-Cell Operation for Ultra High Density Storage Devices," 2009 Symposium on VLSI Technology Digest of Technical Papers, Jun. 16-18, 2009, pp. 136-137.

Komori, et al., "Disturbless Flash Memory due to High Boost Efficiency on BiCS Structure and Optimal Memory Film Stack for Ultra High Density Storage Device", Electron Devices Meeting, IEDM 2008, IEEE International, Dec. 15-17, 2008, San Francisco, California, 4 pages.

Lai et al., "A Multi-Layer Stackable Thin-Film Transistor (TFT) NAND-Type Flash Memory," Electron Devices Meeting, 2006, IEDM '06 International, Dec. 11-13, 2006, pp. 1-4.

U.S. Appl. No. 14/608,053 entitled "Source Line Formation in 3D Vertical Channel and Memory," filed Jan. 28, 2015, 59 pages.

U.S. Appl. No. 14/637,187 entitled "Vertical Thin-Channel Memory," by Hang-Ting Lue, filed Mar. 3, 2015, 90 pages.

U.S. Appl. No. 14/637,204 entitled "U-Shaped Vertical Thin-Channel Memory," by Hang-Ting Lue, filed Mar. 3, 2015, 78 pages.

U.S. Appl. No. 14/643,907 entitled "Forced-Bias Method in Sub-Block Erase," filed Mar. 10, 2015, 45 pages.

U.S. Appl. No. 14/668,728 entitled "Page Erase in Flash Memory," filed Mar. 25, 2015, 47 pages.

U.S. Appl. No. 14/668,790 entitled "Sub-Block Erase," filed Mar. 25, 2015, 53 pages.

\* cited by examiner

3D NON-VOLATILE MEMORY ARRAY WITH SUB-BLOCK ERASE ARCHITECTURE

BACKGROUND OF THE INVENTION

Field of the Invention

The present invention relates to high density memory devices, and particularly to memory devices including a three-dimensional 3D array.

Description of Related Art

As critical dimensions of devices in integrated circuits shrink to the limits of common memory cell technologies, designers have been looking to techniques for stacking multiple planes of memory cells to achieve greater storage capacity, and to achieve lower costs per bit. For example, thin-film transistor techniques are applied to charge trapping memory technologies in Lai, et al., "A Multi-Layer Stackable Thin-Film Transistor (TFT) NAND-Type Flash Memory," IEEE Int'l Electron Devices Meeting, 11-13 Dec. 2006; and in Jung et al., "Three Dimensionally Stacked NAND Flash Memory Technology Using Stacking Single Crystal Si Layers on ILD and TANOS Structure for Beyond 30 nm Node," IEEE Int'l Electron Devices Meeting, 11-13 Dec. 2006.

Another structure that provides vertical NAND strings in a charge trapping memory technology is described in Katsumata, et al., "Pipe-shaped BiCS Flash Memory with 16 Stacked Layers and Multi-Level-Cell Operation for Ultra High Density Storage Devices," 2009 Symposium on VLSI Technology Digest of Technical Papers, 2009. The structure described in Katsumata et al. includes vertical NAND gates, using dielectric charge trapping technology to create a storage site at each gate/vertical channel interface. The memory structure can be arranged as a straight vertical NAND with a column of semiconductor material arranged as the vertical channel for the NAND gate, with a lower select gate for connection to a common source line adjacent the substrate, and an upper select gate on top for connection to bit lines. A plurality of horizontal word lines is formed using planar word line layers that intersect with the columns, forming so-called gate-all-around cells. Alternatively, the memory structure of Katsumata et al. can be arranged so that two adjacent columns of gate-all-around cells are connected at the bottom to form a U-shaped NAND string, in which a first select gate on top of one column acts as a string select gate, and a second select gate on top of the adjacent column acts as a ground select gate. See also, Komori et al., "Disturbless Flash Memory due to High Boost Efficiency on BiCS Structure and Optimal Memory Film Stack for Ultra High Density Storage Device," Electron Devices Meeting IEDM December 2008.

Other approaches have included vertical gate technologies, such as have been described in U.S. Pat. No. 8,503,213, entitled Memory Architecture Of 3D Array With Alternating Memory String Orientation And String Select Structures, issued 6 Aug. 2013 by inventors Chen et al.

For conventional NAND Flash architecture, the "block" is defined by a physical grouping including the NAND strings configured between a set of bit lines (BLs) and a common source line (CSL) with a set of intersecting word lines (WLs). See, U.S. Patent Application Pub. No. 2013/0279251, entitled "Novel Shielding 2-Cycle Half-Page Read And Program Schemes For Advanced Nand Flash Design," published 24 Oct. 2013, by inventor Lee. In a NAND flash, each NAND string includes a first switch, often called a string select switch, for connecting a selected NAND string to a corresponding bit line, and a second switch, often called a ground select switch, for connecting a selected NAND string to a common source line. The common source line is referred to herein as a reference line RL in view of the fact that it can be biased to act either as a source or drain depending on the biasing arrangement applied. The second switch in this configuration is referred to herein as a reference select switch, in view of the fact that the reference line to which it connects the NAND strings can be biased in a number of ways other than simply ground.

The control signals for the string select switch and reference select switch on each NAND string present a structural complexity in 3D structures. For example, NAND strings in a block that share a bit line must be at least one SSL for each. The control signal for the second switch is often called the ground select line GSL, and is referred to herein as a reference select line RSL. Blocks of NAND strings have been configured in the prior art in which all of the second switches share a single RSL. This reduces the complexity of the reference select line RSL structure substantially, and reduces the amount of signal wiring required in the memory.

In typical operation, the erase (ERS) unit usually corresponds to a block, which is the so-called "block erase." During ERS operations, the WLs that intersect the block are applied the same bias, and in the substrate well on which the memory block is implemented in a 2D array, the bit lines and the common reference line are appropriately biased to cause the threshold voltage (Vt) of all cells in the same block to be lowered below an erase threshold level. A block erase typically erases all of the NAND strings which share a common reference select line RSL and are therefore connected to the common reference line RL as a unit. As a result, the biasing arrangements available for erase are limited by the structure which requires the same common source line bias to be applied to all of the NAND strings in the block.

For a given chip capacity, a larger block size (ERS unit) means a smaller number of blocks in the array arrangement. However, some memory management operations, such as garbage collection and wear leveling, operate on erase block units. A small number of large blocks can enlarge the time used for block level memory management. A smaller number of large blocks for a given memory capacity may require more operations for memory management on each block. Also, the memory management routines that operate on block boundaries can require erase and program operations to move data around, and the program and erase cycling consumes the cycling endurance of the memory cells. Therefore, the block size can directly affect performance of the product in a number of ways.

Some ways to address the problems related to the size of an erase block are described in commonly owned, and co-pending U.S. patent application Ser. No. 14/643,907, entitled "Forced-Bias Method In Sub-Block Erase," filed 13 Mar. 2015 by inventors Kuo-Pin Chang, Hang-Ting Lue and Wen-Wei Yeh (MXIC 2148-1); and commonly owned, and co-pending U.S. patent application Ser. No. 14/668,728, entitled "Page Erase In Flash Memory," filed 25 Mar. 2015 by inventor Kuo-Pin Chang (MXIC 2149-1); which applications are incorporated by reference as if fully set forth herein.

It can be desirable therefore to provide architectures and operating methods for 3D memories which do not sacrifice memory capacity, while supporting a smaller erase unit.

SUMMARY

A memory device is described having a structure which supports sub-block erase in NAND memory including a plurality of blocks. Each block in the plurality of blocks is coupled to a set of Y reference lines, where Y is two or more. Each block in the plurality of blocks includes a single reference select line RSL, which is operable to connect each sub-block in the block to a corresponding reference line in the set of Y reference lines. A control circuit can be included on the device which is configured for an erasing method described herein to erase a selected sub-block in a selected block.

In one erase method, the controller can execute an erase operation in response to a command to erase a selected sub-block in a selected block. The erase operation can include applying an erase bias arrangement including a first bias (e.g. −2 V) on a reference select line coupled to all of the NAND strings in a set of Y sub-blocks in the selected block, a second bias (e.g. +18 N) on a selected one of the Y reference lines in the selected block, and a third bias (e.g. floating or +2 V) on at least one unselected reference line of the Y reference lines. An erase bias arrangement is described which causes gate induced drain leakage GIDL current in the NAND strings of the selected sub-block and inhibit GIDL current in the NAND strings of an unselected sub-block. The erase bias arrangement can include applying a common bias (e.g. 0 V) to all of the word lines in the block. The erase bias arrangement can include floating the bit lines and the string select lines which are coupled to the block.

Embodiments described herein include memory cells implemented using dielectric charge trapping structures. In such embodiments, the erase bias arrangement can be configured to induce hole tunneling to erase the memory cells in selected sub-blocks.

A NAND memory is described which includes a plurality of blocks of memory cells, bit lines, word lines and reference lines. Each block in the plurality of blocks is operably coupled to a set of X bit lines BL(x), a set of Z word lines WL(z), and a set of Y reference lines RL(y), where Y is two or more. Each block includes an array of NAND strings. Each NAND string in the block array includes memory cells coupled to each word line WL(z) in the set of Z word lines. The NAND strings in the array have respective string select switches and reference select switches. Each block includes a string select line set, including N string select lines coupled to the string select switches of NAND strings in corresponding columns in the array of the block. Each string select line SSL(n) in the string select line set is configured to control the string select switches in one column of the NAND strings in the array for selective connection to corresponding bit lines BL(x) in the set of X bit lines. A reference select line RSL is coupled to the reference select switches of all of the NAND strings in the block, and is configured to control the reference select switches for connection of NAND strings in the Y sub-blocks of the array to corresponding reference lines RL(y) in the set of Y reference lines.

The NAND memory can be implemented using a variety of NAND string structures. For example, in one embodiment, the NAND strings are disposed vertically with a plurality of word line levels having one word line for each NAND string in each word line level, the string select lines in an upper level above the word line levels, and the reference select line in a lower level below the word line levels. In another example, the NAND strings are disposed vertically in a U-shape, with a plurality of word line levels with two word lines for each NAND string (one word line the downward leg of the U, and one word line for the upward leg of the U) in each word line level. The string select lines are disposed in an upper level above the word line levels, and the reference select line is disposed in said upper level or in another level above the word line levels. Bias circuitry can be included in the memory device to apply an erase bias arrangement such as that described above. The bias circuitry can be configured to apply a sub-block erase bias arrangement including the same bias to the bit lines, the same bias to the string select lines, the same bias to the word lines, and the same bias to the ground select lines of every NAND string in the block, while applying a first bias on the reference line of the selected sub-block and a second bias on the reference line or reference lines of the unselected sub-block or unselected sub-blocks.

A 3D vertical NAND structure is described in which each block in the plurality of blocks comprises a plurality of stacks of conductive strips, including even stacks and odd stacks, and a plurality of active pillars arranged between the even and odd stacks of conductive strips. The active pillars comprise even and odd vertical channel films having outside surfaces and inside surfaces, defining a multilayer array of interface regions at cross points between outside surfaces of the even and odd vertical channel films and conductive strips in the corresponding even and odd stacks. The even and odd vertical channel films are connected to form a current path from an upper end to a lower end of the even vertical channel film, and from a lower end to an upper end of the odd vertical channel film to present a U-shaped path. A 3D array of NAND strings is disposed in the structure of the block, including even memory cells in the interface regions accessible via the active pillars and conductive strips in the even stacks of conductive strips, and odd memory cells in the interface regions accessible via the active pillars and conductive strips in the odd stacks of conductive strips. The even and odd memory cells in a given active pillar are connected in series as a single NAND string. Conductive strips in an upper level of the even stacks can be configured as the string select lines in a set of string select lines for the block. Conductive strips in an upper level on the odd stacks can be connected together and configured as the single reference select line for the block. Conductive strips in intermediate levels in the even and odd stacks are configured as word lines for the NAND strings. Sub-blocks of the NAND strings in the array of the block are configured to connect to respective reference lines in the set of Y reference lines. The 3D vertical NAND structure can be implemented on a device with a controller to execute an erase operation as described above.

A separated reference line block structure is proposed to provide a smaller erasable unit. The technology described provides for a number of features, including the following:
  (1) Sub-block Erase
  (2) Floating BL Erase
  (3) Separated Common Source Line (reference line) Blocks
  (4) 3D NAND RSL decoding by block
  (5) 3D NAND Erase Operation by sub-block.

Other aspects and advantages of the present invention can be seen on review of the drawings, the detailed description and the claims, which follow.

DETAILED DESCRIPTION

A detailed description of embodiments of the present invention is provided with reference to the FIGS. 1-17.

Figure 1:
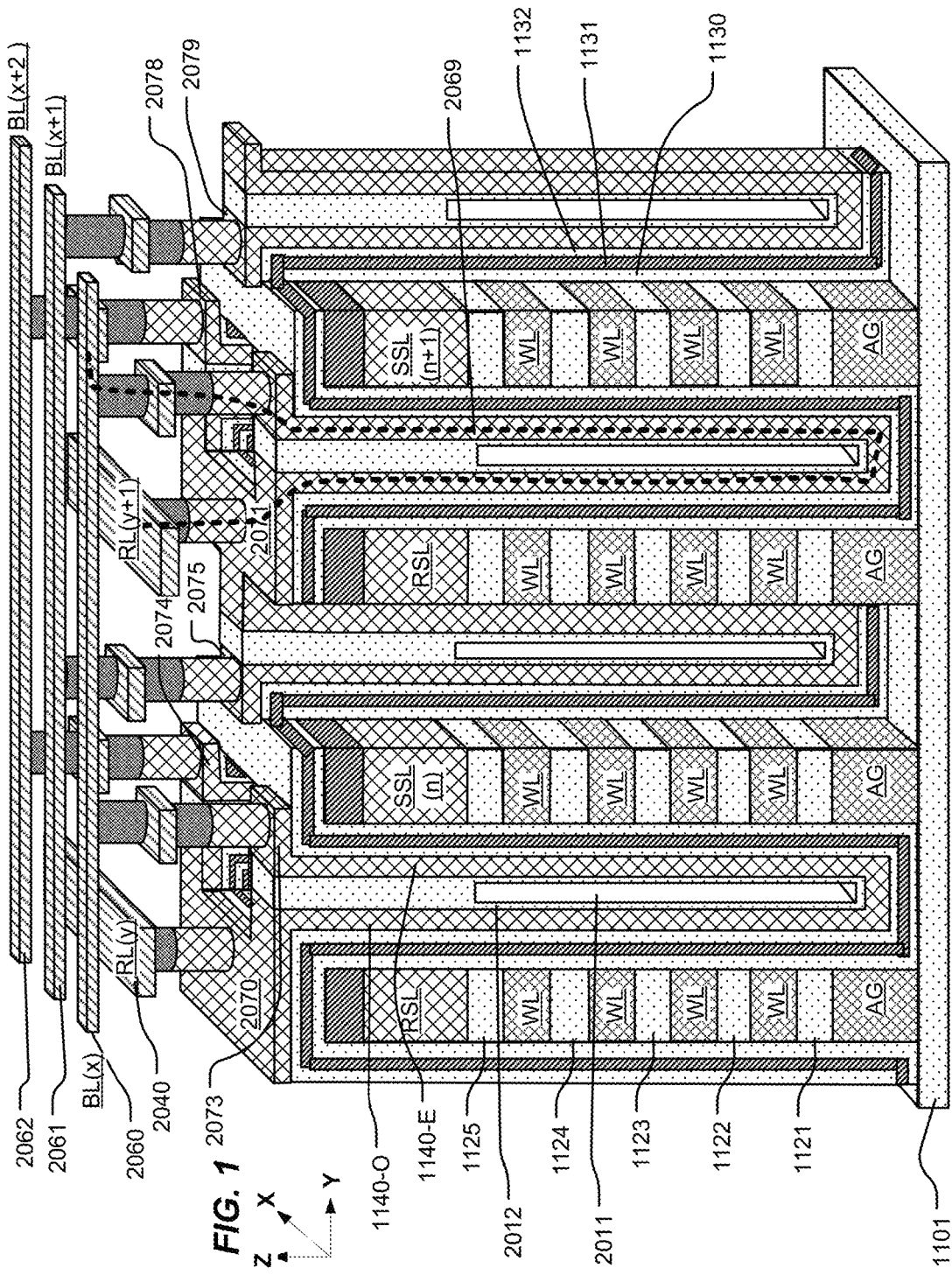
FIG. 1 is an illustration of an example structure of a 3D vertical NAND memory, with U-shaped NAND strings formed in thin-film channels, configured for sub-block erase.

FIG. 1 is an illustration of a 3D NAND memory structure like that described in detail in commonly owned and co-pending U.S. patent application Ser. No. 14/637,204, filed 3 Mar. 2015 entitled "U-Shaped Vertical Thin-Channel Memory," which application is incorporated by reference as if fully set forth herein.

FIG. 1 shows a memory device in which stacks of conductive strips alternating with insulating layers 1121-1125 are disposed on an insulating substrate 1101. The stacks are separated by trenches. First and second stacks of conductive strips have sidewalls on first and second sides of the trench separating the stacks. Data storage structures including memory layers are formed on the sidewalls of the strips in the trenches.

The memory layers can comprise a multilayer data storage structure, as illustrated including a tunneling layer 1132, a charge storage layer 1131, and a blocking layer 1130. In one preferred example, the memory layer is implemented as illustrated below with reference to FIG. 16.

Vertical channel structures are disposed over the memory layers in the trenches between the first and second stacks. Each vertical channel structure includes a first semiconductor film 1140-E (even strip) in an even stack and a second semiconductor film 1140-O (odd strip) in an odd stack disposed vertically in contact with the data storage structures on opposing sides of the trench. The even and odd strips are electrically connected at the bottom of the trench. The inside surfaces of the semiconductor films are separated by an insulating structure which in this example includes a layer of insulating material (e.g. 2012) and a gap (e.g. 2011) in the regions of the memory cells. For thin-channel embodiments, the even and odd semiconductor films in the vertical channel structures have thicknesses of 10 nm or less.

An upper strip in a first stack is configured as a gate of a first switch, e.g. an SSL switch, having a channel in the first semiconductor film, and an upper strip of a second stack is configured as a gate of a second switch, e.g. a RSL switch, having a channel in the second semiconductor film. Intermediate strips in the first and second stacks are configured as word lines WL. Bottom strips in the first and second stacks are configured as assist gates AG. A patterned conductor layer or layers overlie the stacks. A first interlayer connector connects a first conductor 2060 (e.g. bit line BL(x)) to a top surface of the first semiconductor film in an active pillar. A second interlayer connector connects a second conductor 2040 (e.g. reference line RL(y)) to a top surface of the second semiconductor film in a vertical channel structure. Also, additional vertical channel structures disposed between the same first and second stacks are configured so that the second semiconductor films on the second side of the trench are all electrically connected, and can share connection to the same reference line. In some embodiments, second semiconductor films are patterned so that portions of the vertical channel structures along a single stack are connected to corresponding reference lines. Furthermore, the additional vertical channel structures between the same first and second stacks are configured so that the first semiconductor films on the first side of the trench are electrically separated, and can be individually connected to separate bit lines using individual interlayer connectors (e.g. third interlayer connectors).

A vertical channel structure between the third stack and the second stack includes a first semiconductor film along the first side of the trench on the sidewall of the second stack between the third and second stacks, and a second semiconductor film along a second side of the trench between the third and second stacks. The first semiconductor film of the vertical channel structure between the third stack and the second stack can be electrically connected (by portion 2071) to the second semiconductor film of the vertical channel structure between the first stack and the second stack.

FIG. 1 illustrates a circuit path 2069 for the current flow for a U-shaped NAND string which is connected between the reference line RL(y+1) and the bit line BL(x). The structure shows a plurality of active pillars between corresponding even and odd stacks of conductive strips. The active pillars comprise semiconductor films having outside surfaces and inside surfaces. The outside surfaces are disposed on the data storage structures on the sidewalls of the corresponding even and odd stacks forming a 3D array of memory cells. The memory cells are connected to form a current path from an upper end to a lower end of the even vertical channel film, and from a lower end to an upper end of the odd vertical channel film.

FIG. 1 illustrates a 3D NAND memory structure including a second patterned conductor layer, such as a metal layer in a process flow, including conductors 2060, 2061, 2062 over interlayer connectors configured as bit lines BL(x), BL(x+1) and BL(x+2) in this example. As illustrated in FIG. 1, the portion 2070 of the thin-film semiconductor layer which is connected to the vertical channel films on the RSL sides of NAND strings in active pillars along a row is connected by interlayer connectors to conductor 2040 in the first patterned conductor layer, configured as a first sub-block reference line RL(y). Likewise, the portion 2071 of the thin-film semiconductor layer which is connected to the vertical channel films on the RSL sides of NAND strings in active pillars along a row is connected by interlayer connectors to conductor in the first patterned conductor layer, configured as a second sub-block reference line RL(y+1). The portions 2073 and 2079 of the thin-film semiconductor layer which are connected to SSL sides of NAND strings in active pillars along a first column in the array are connected by interlayer connectors to a first bit line conductor 2060. The portions 2075 and 2079 of the thin-film semiconductor layer which are connected to SSL sides of NAND strings in active pillars along a column in the array are connected by interlayer connectors to a second bit line conductor 2061 (BL(x+1). The portions 2074 and 2078 of the thin-film semiconductor layer which are connected to SSL sides of NAND strings in active pillars along a column in the array are connected by interlayer connectors to a third bit line conductor 2062 (BL(x+2).

Figure 2:
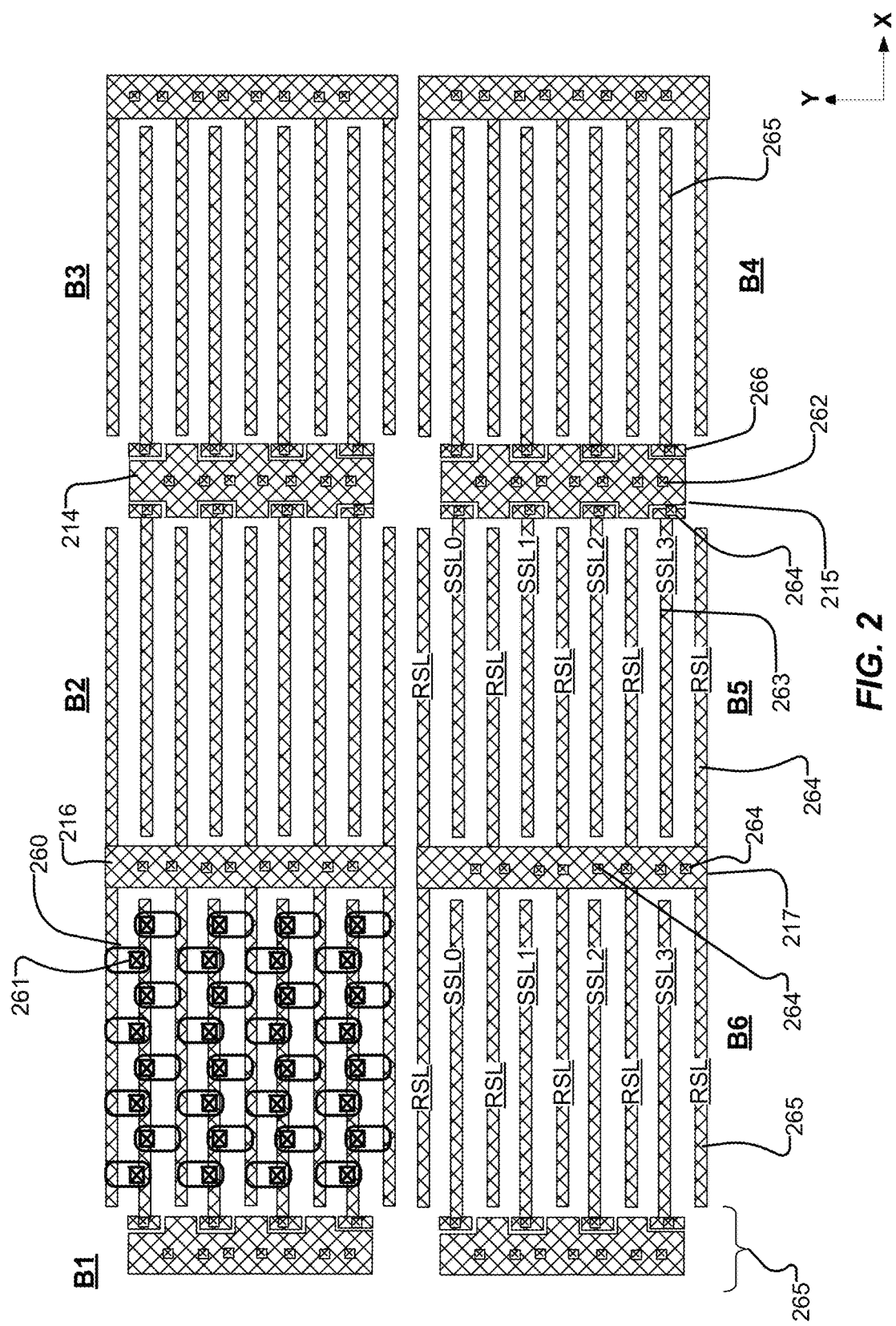
FIG. 2 illustrates a layout view of word line, SSL and RSL structures for a 3D NAND as described with reference to FIG. 1.

FIG. 2 illustrates a layout view of a plurality of 3D blocks of a memory array comprising U-shaped NAND strings as shown in FIG. 1. In the layout illustrated, there are six blocks B1-B6 arranged into rows. Along the rows, the blocks are laid out in a mirror image format. The pattern of an upper layer in the plurality of stacks of conductive strips is illustrated, where the conductive strips extend from a landing pad area shared in common with other conductive strips in the block. The intermediate and lower layers in the plurality of stacks have the same layout and can be formed in the same patterning step, with the exception that the conductive strips configured as SSL lines are cut to provide for individual contacts. Each block includes strips separated from, and extending from, a first landing area (e.g. areas 214 and 215) configured for SSL lines, and underlying even word lines, and strips extending from and connected to a second landing area (e.g. areas 216 and 217) configured for RSL lines, and underlying odd word lines. The landing areas can support strips in adjacent blocks. Thus, the landing area 216 is used for conductive strips laid out in mirror image in blocks B1 and B2. In this example, the RSL line is shared between mirror image blocks B1 and B2. In other embodiments, the top landing area used for the RSL line may be divided, providing for independent RSL decoding for the mirror image blocks (e.g. B5 and B6). The landing area 214 used for conductive strips on the SSL side is laid out in mirror image in blocks B2 and B3.

The SSL lines in the upper layer of the stacks are separated into individual landing areas. Thus, for example, an SSL line 263 in a block B5 connects to the landing pad area 264 and an SSL line 265 in block B4 connects to the landing pad area 266. Interlayer conductors, represented by the symbol 262, are connected to the respective SSL landing areas (e.g. 264, 266). Also, the diagram schematically illustrates interlayer connectors which go through the upper layer of the stack to make individual connection to each of the underlying layers in a stairstep fashion, for example. Thus, the RSL pads (e.g. on landing area 216) include eight interlayer connectors, one for a top layer, six for intermediate layers which include the odd word lines, and one for the bottom layer which can include the assist gate, a dummy word line or another word line, for example. The SSL pads (e.g. on landing area 215) include the separate interlayer connectors for each of the SSL landing areas (e.g. 266), and seven interlayer connectors for connection to underlying layers, including six for the intermediate layers which include the even word lines, and one for the bottom layer.

The conductive strips extending from the RSL areas (e.g. 217) are laid out in an interdigitated fashion with the conductive strips extending from the SSL areas (e.g. 215). As illustrated by the labeling block B6, the upper layer of the stack includes five RSL lines coupled in common to the pad having RSL landing areas 217, and four SSL lines SSL0-SSL3.

The structure supports formation of an array of active pillars laid out as illustrated by the labeling of block B1. In block B1, an active pillar is represented by the symbol 260 and its interlayer conductor for connection to the bit line as indicated by the symbol 261. The interlayer conductor for connection to the sub-block reference lines are not illustrated to reduce crowding in the figure. A row of four active pillars is arrayed along the upper side of each SSL line and four active pillars are arrayed along a lower side of each SSL line offset in the horizontal direction from the active pillars on the upper side of the SSL line, by the bit line pitch, so that there are eight active pillars on each SSL line, four on each side, and each configured for connection to a different bit line. The number of word lines in this layout with six layers of conductive strips, one of which provides RSL and SSL lines, and one of which provides assist gates, allows for four layers of word lines. As a result, a U-shaped NAND string in each active pillar includes eight (8) memory cells arranged in series. The number of layers of conductive strips is a factor which determines the number of memory cells in the U-shaped NAND strings. The number of active pillars on each SSL line determines the number of cells which can be connected to bit lines simultaneously from a single block in this configuration.

The structure supports sub-block erase as discussed in more detail below, in which a selected sub-block within a selected block, such as block B6, can be erased by applying an erase bias arrangement that is the same for the bit lines, all the SSL lines, the RSL line and all the word lines in the block, and distinguishes between the sub-blocks by applying different bias to the reference lines RL(y) and RL(y+1).

Figure 3:
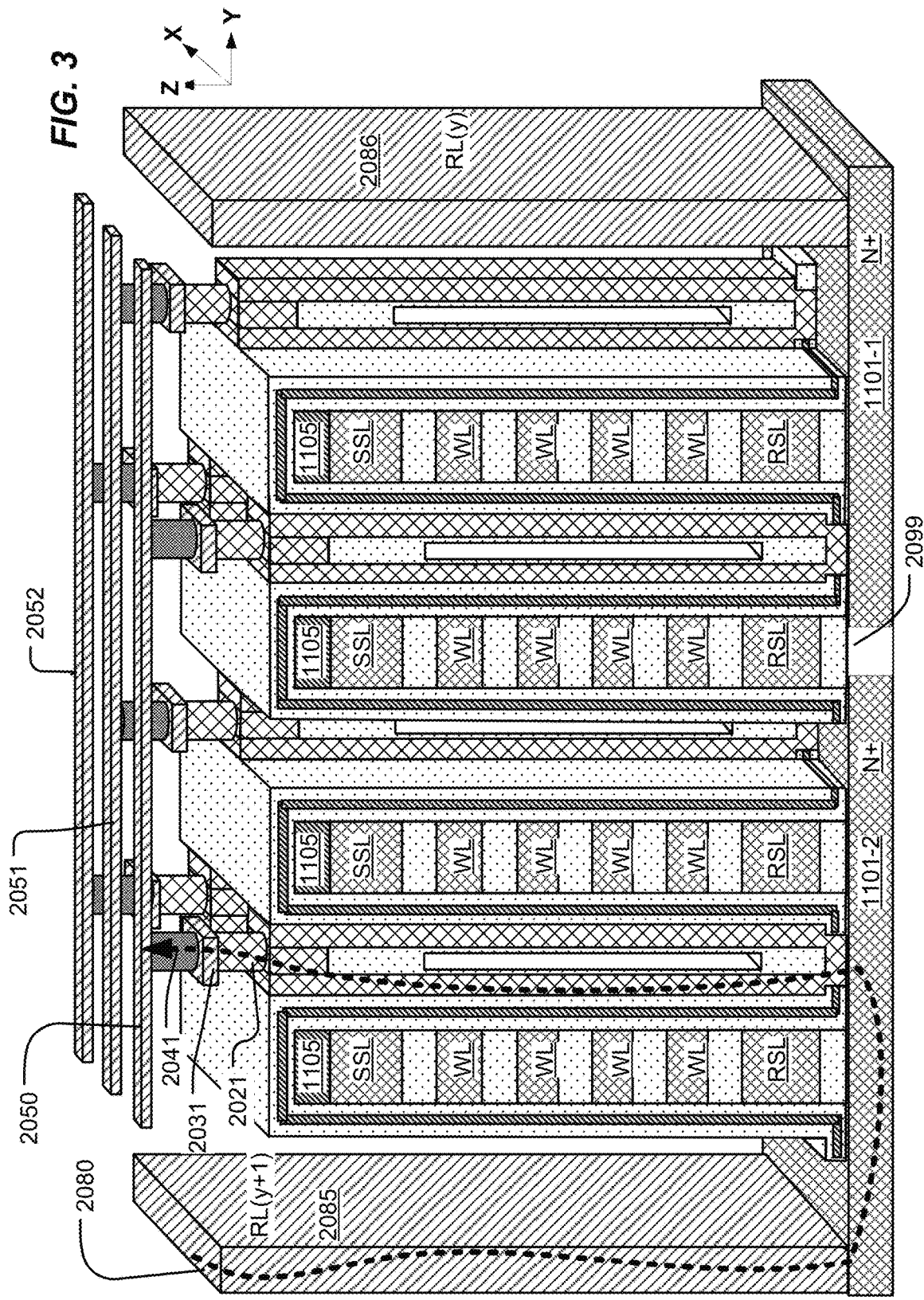
FIG. 3 is an illustration of an example structure of a 3D vertical NAND memory, with independent double gate NAND strings formed in thin-film channels, configured for sub-block erase.

FIG. 3 illustrates an alternative NAND structure using independent double gate NAND strings, configured for sub-block erase, like that described in commonly owned and co-pending U.S. patent application Ser. No. 14/637,187, filed 3 Mar. 2015, entitled "Vertical Thin-Channel Memory," by Lue (MXIC 2147-1A), which application is incorporated by reference as if fully set forth herein.

The structure includes a plurality of stacks of conductive strips alternating with insulating layers formed on a reference line structure in a substrate. The reference line structure includes a first reference line conductor 1101-1 and a second reference line conductor 1101-2 (e.g. conductive wells in a semiconductor substrate, or patterned conductive layers over a substrate) which are separated by an isolation region 2099.

Reference line conductors 1101-1 and 1101-2 are coupled to respective interlayer conductors 2085 and 2086, which are configured as separate sub-block reference lines RL(y) and RL(y+1) for the block of NAND strings in the structure. The interlayer conductors 2085 and 2086 are configured as elongated walls parallel to the plurality of stacks of conductive strips, extending to the surface of the reference line conductors 1101-1 and 1101-2. The interlayer connectors 2085 and 2086 can comprise a conductive material such as tungsten or other metal in some embodiments. Also, the interlayer connectors 2085 and 2086 can comprise a doped semiconductor material. The interlayer connectors 2085 and 2086 can be disposed adjacent each block of stacks in an array of blocks. Also, interlayer connectors can be disposed within the blocks of stacks in some embodiments as necessary by, for example, replacing one of the stacks of conductive strips with a conductive material, or by utilizing a row of vertical channel structures as connectors to the reference line conductors 1101-1 and 1101-2.

The stacks include a bottom plane (RSL) of conductive strips, a plurality of intermediate planes (WLs) of conductive strips, and a top plane of conductive strips (SSLs). The plurality of intermediate planes can include Z planes, ranging from 0 to Z−1 for the stack. A top layer 1105 of silicon nitride is disposed on each stack in this example. Although not shown, the conductive strips are linked by pads such as discussed with reference to FIG. 4, which can be defined in the pattern used for etching the stacks. The stacks include layers of insulating material separating the conductive strips from one another, and from the reference conductors 1101-1 and 1101-2.

Vertical channel structures are disposed between the even stacks and odd stacks. The vertical channel structures are disposed between the even and odd stacks in this example. The vertical channel structures comprise even and odd semiconductor films that act as vertical channel films, having outside surfaces and inside surfaces. The outside surfaces are disposed on and contact the data storage structures on the sidewalls of the corresponding even and odd stacks forming a 3D array of memory cells. The inside surfaces are separated by an insulating structure, which in this example includes a layer of insulating material (e.g. 2012) and a gap (e.g. 2011) in the regions of the memory cells. For thin-channel embodiments, the even and odd semiconductor films in the vertical channel structures have thicknesses of 10 nm or less.

The structure includes bit lines 2050, 2051, 2052 in this example in contact with via interlayer conductors (e.g. 2041, 2031, 2021) to corresponding columns of vertical channel structures.

FIG. 3 includes a line 2080 illustrating a current path for accessing memory cells in a vertical channel film on one side of the vertical channel structure. The current path proceeds through the interlayer connector 2085 to the reference line conductor 1101-2. From the reference line conductor 1101-2, the current path proceeds through interlayer conductor 2085 to another reference line conductor (not shown) in a patterned conductor layer overlying the stack.

Figure 4:
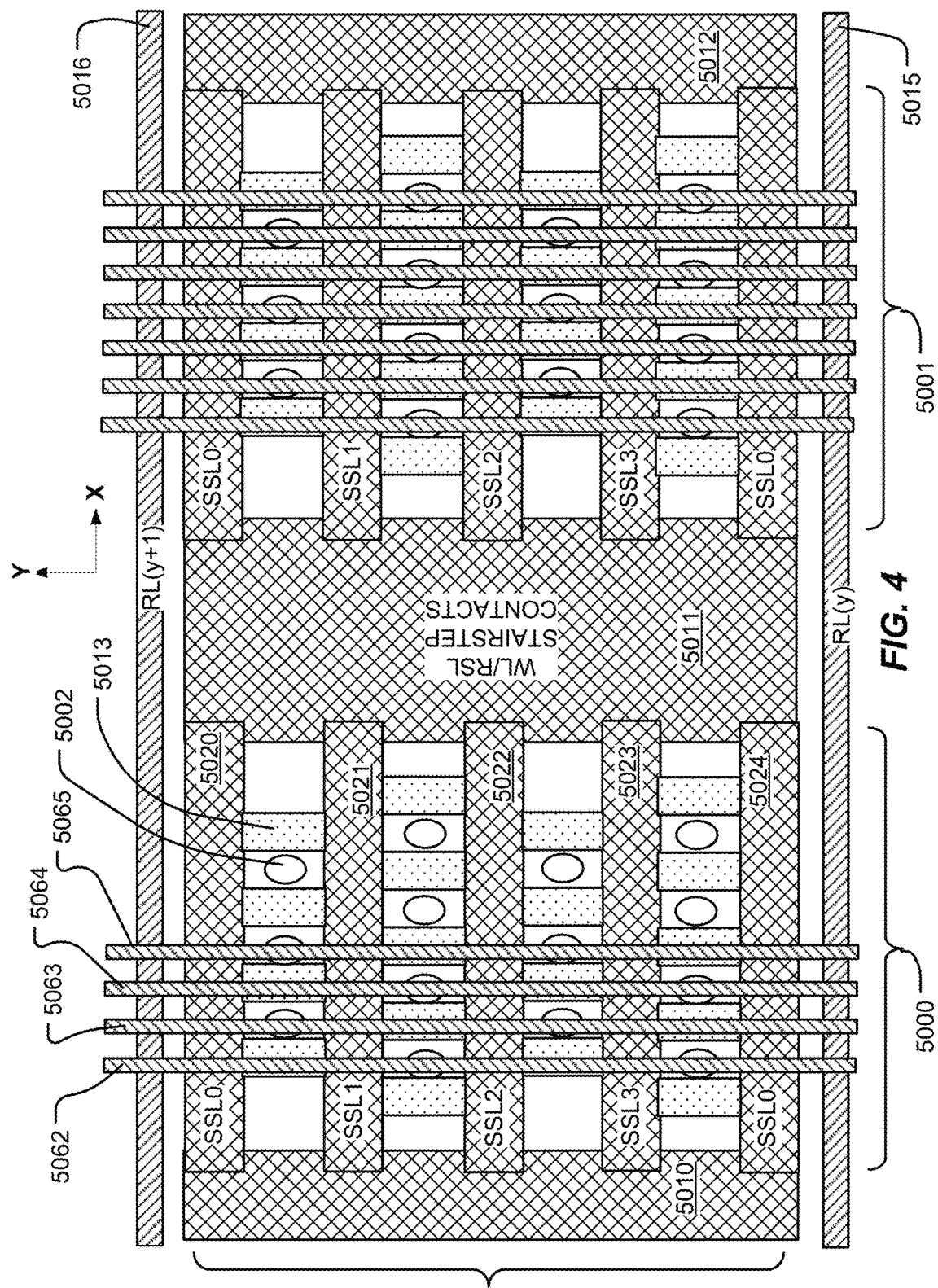
FIG. 4 illustrates a layout view of word line, SSL and RSL structures for a 3D NAND as described with reference to FIG. 3.

FIG. 4 illustrates the layout of the stacks of conductive strips, the reference line interlayer conductors for sub-block reference lines RL(y) and RL(y+1) and the bit lines for one example of an integrated circuit using the vertical thin-channels like that of FIG. 3. In FIG. 4, a first block 5000 and a second block 5001 are illustrated. The vertical active pillars represented by the ovals (e.g. 5002) and the insulating structures that separate the active pillars are represented by the rectangles 5013.

The upper layer of the stacks of conductive strips comprises string select lines SSL. In the illustrated example, five conductive strips 5020, 5021, 5022, 5023, 5024 in block 5000 provide for SSL lines, SSL0 to SSL3. Block 5001 shares the contact structure 5011 with block 5000. As illustrated, SSL0 in block 5000 includes the conductive strip 5020 and the conductive strip 5024. The active pillars on the lower edge of conductive strip 5020, and the active pillars on the upper edge of conductive strips 5024 provide a pair of memory cells controlled by the SSL line and connected to different bit lines 5062-5065 (some of the bit lines over the block 5000 are removed for the purposes of the illustration). For example, bit line 5062 is connected to the active pillar which is adjacent to the conductive strip 5024 of SSL0. The bit line 5063 is connected to the active pillar which is adjacent to the conductive strip 5020 of SSL0.

The word lines and RSL lines are formed in underlying layers of the plurality of stacks and obscured by the SSL lines in this illustration. The word lines and RSL lines terminate in respective pads 5010, 5011, 5012 in which stairstep contact structures are implemented to provide for interlayer connection from each layer to overlying patterned conductors. The overlying patterned conductors can provide word line strapping in a patterned metal layer overlying the plurality of stacks, to reduce the resistance for propagation of word line signals across a plurality of blocks. In a representative embodiment, the stairstep contacts for word line strapping can be spaced along the structure periodically. For example, the stairstep contacts can be placed every 100μ along the plurality of blocks. In other embodiments, the spacing can be other intervals as needed for a particular implementation.

The interlayer conductors 5015, 5016 connected to the underlying reference conductors RL(y) and RL(y+1) are disposed outside the plurality of stacks of conductive strips for corresponding blocks. Thus, the layout of the interlayer conductors 5015, 5016 is absorbed by the block layout overhead, rather than by structures inside the block. Thus, for the purpose of description of these locations, the plurality of stacks of conductive strips can be characterized as having outside stacks and inside stacks. The interlayer conductors 5015, 5016 are disposed outside the outside stacks of the plurality of stacks of conductive strips for each block, which are terminated in a common stairstep contact structure (e.g. pad 5011).

The number of SSL lines in a given block can be much higher, such as for example 16 or 32. Likewise, the number of bit lines can be much higher as suits a particular implementation.

The RSL line in a given block has a pattern which matches the layout of the word lines, so that all of the NAND strings in each block share a single comb shape RSL conductor. In this example, the two blocks 5000 and 5001 include a single RSL conductor which is shared between the blocks. In other embodiments, each block can be provided its own RSL conductor by dividing the stairstep contacts.

The shared RSL line for the block connects all of the NAND strings in parallel to their corresponding sub-block reference lines RL(y) or RL(y+1) in this example.

An erase bias arrangement for sub-block erase can be applied to the structure shown in FIGS. 3 and 4, in which the bias applied is the same for all the bit lines, the same for all the SSL lines, and the same for all the word lines, and set for the RSL conductor for the block, while the sub-block reference lines RL(y) and RL(y+1) receive separate bias to induce sub-block erase or to inhibit sub-block erase.

Figure 5:
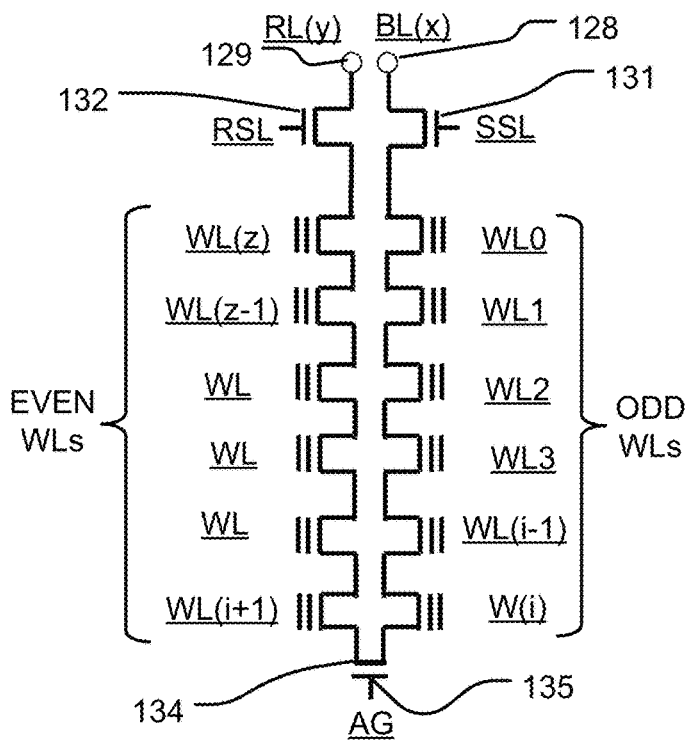
FIG. 5 is a schematic diagram of a U-shaped vertical NAND string which can be implemented as described with reference to FIGS. 1 and 2, including a reference select line.

FIG. 5 is a schematic diagram of a U-shaped NAND string, such as that implemented in the structure of FIGS. 1 and 2. In alternative U-shaped NAND string structure is described in the in Katsumata, et al. publication referred to above, ("*Pipe-shaped BiCS Flash Memory with 16 Stacked Layers and Multi-Level-Cell Operation for Ultra High Density Storage Devices,*" 2009 Symposium on VLSI Technology Digest of Technical Papers, 2009), which publication is incorporated by reference, as if fully set forth herein.

The U-shaped NAND string shown schematically in FIG. 5 is connected between a bit line contact 128 for the bit line BL(x) and a reference line contact 129 for the sub-block reference line RL(y). The active pillar is disposed between even and odd stacks of conductors, where an upper level in the odd stack in this example includes a string select line which acts as a gate for a first switch 131 in the NAND string, and an upper level in the even stack includes a reference select line which acts as a gate for a second switch 132 in the same NAND string. Intermediate levels in the stack include even and odd word lines, where the odd word lines include word line WL0 to word line WL(i), and the even word lines include word line WL(i+1) to word line WL(z). At the bottom 134 of the stack, the semiconductor thin-films providing the thin-channel structures are electrically connected, such as being formed by a single continuous thin-film which lines the space between the stacks of conductive strips.

In the Katsumata, et al. U-shaped NAND structure, the word lines and reference select lines are implemented using gate-all-around structures using two separate active pillars. However, schematically it can be represented by FIG. 5 as well.

In the illustrated embodiment, an assist gate structure 135 is included which is coupled by a gate dielectric to the semiconductor thin-film in the bottom of the stack. The assist gate structure 135 can be used to induce an inversion region that improves the conductivity of the strip between the even and odd sides. This assist gate can be implemented using a doped region in the substrate beneath the active pillars, or using other techniques. The U-shaped strings comprise series connected even memory cells disposed on the side of the even stack and odd memory cells disposed on the side of the odd stack.

Figure 6:
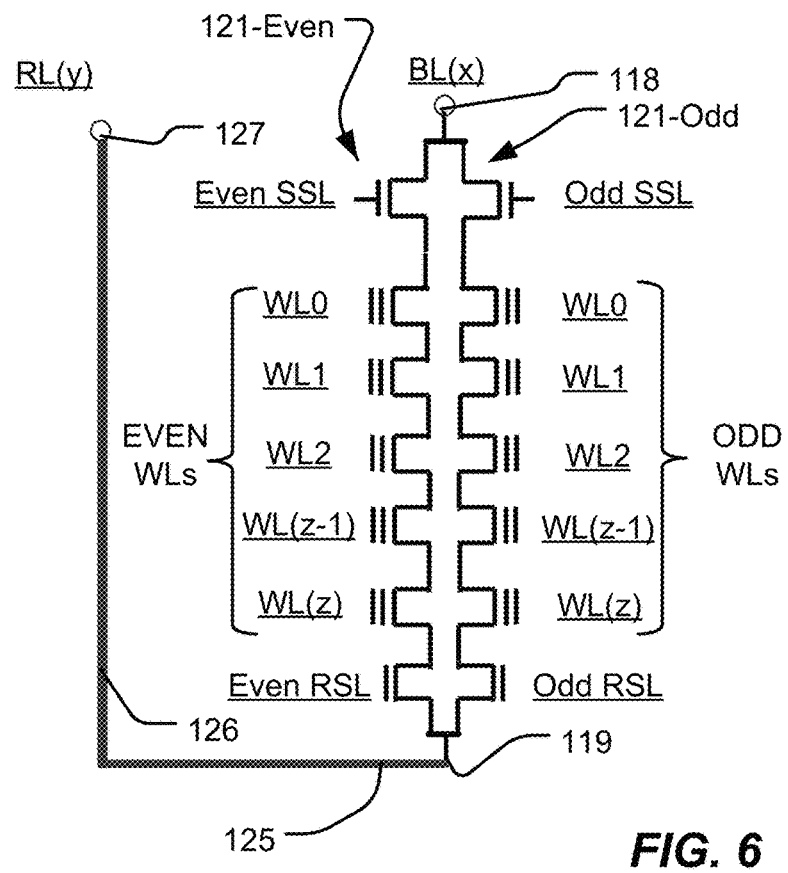
FIG. 6 is a schematic diagram of a vertical, independent double gate NAND string which can be implemented as described with reference to FIGS. 3 and 4, including even and odd reference select lines

FIG. 6 is a circuit schematic of a single active pillar in the structure of FIGS. 3 and 4, showing independent NAND strings on each side of the pillar. The active pillar extends from a bit line contact 118 to a sub-block reference line contact 119. The reference line contact 119 connects the active pillar to a horizontal reference line segment 125, which is connected via an interlayer reference line conductor 126 to a contact 127 for a patterned conductor which can act in combination as a sub-block reference line RL(y) for the sub-block. As illustrated, the active pillar between contacts 118 and 119 includes an even NAND string 121-Even and an odd NAND string 121-Odd. The pillar is disposed between even and odd stacks of conductors, where an upper level in the even stack includes an even string select line and an upper level in the odd stack includes an odd string select line. Intermediate levels in the stack include even and odd word lines WL0 to WL(z) for respective even and odd NAND strings. A lower level in the stack includes an even reference select line RSL and an odd reference select line RSL which are connected together to form a single conductor as described with reference to FIG. 4.

Figure 7:
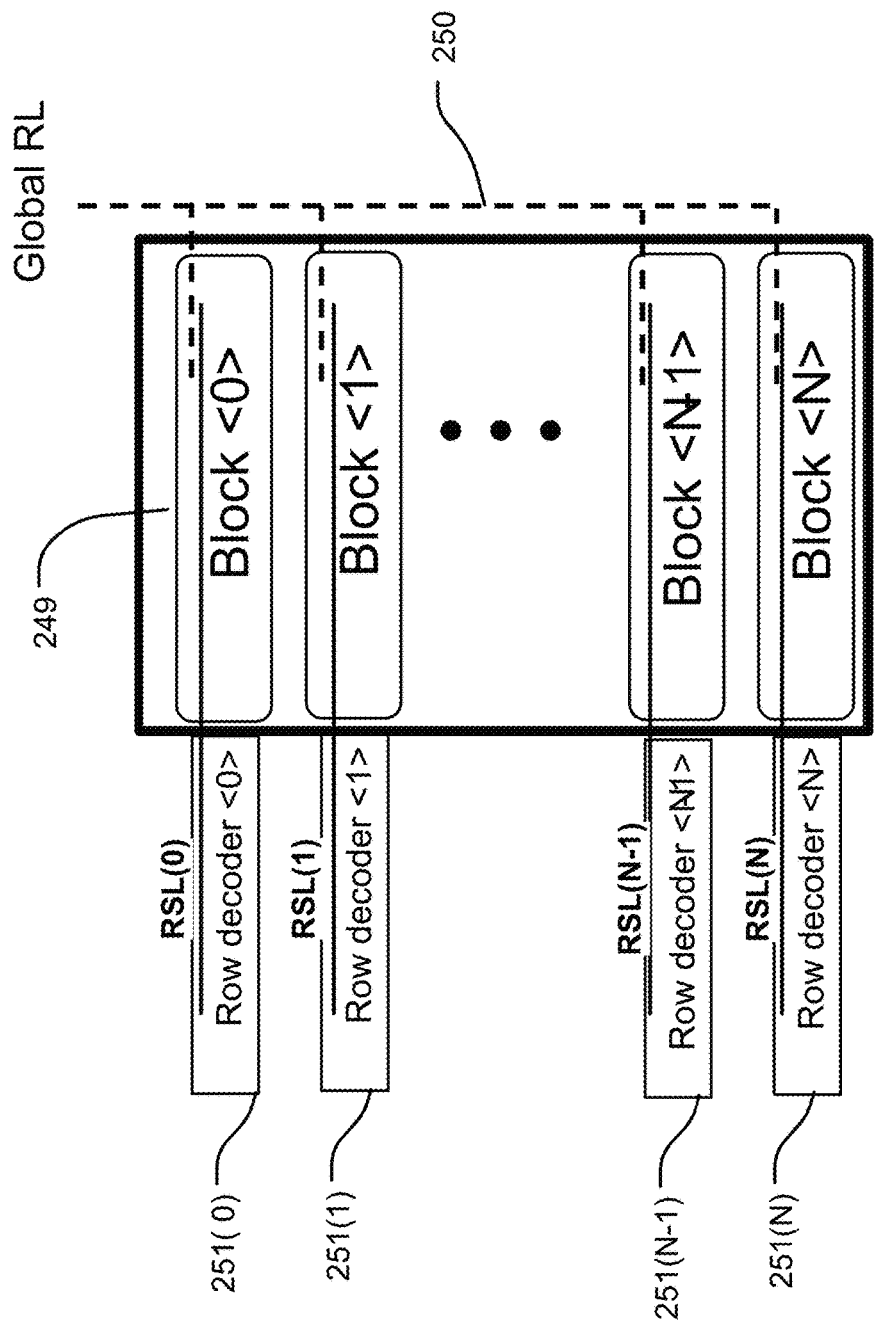
FIG. 7 is a simplified block diagram of a memory including a plurality of blocks and a global reference line according to the prior art.

FIG. 7 is a simplified schematic diagram of a memory device according to the prior art including memory 249 with a plurality of blocks Block<0> to Block<N>, which can be implemented using vertical channel 3D NAND strings. In this prior art example, a single or "global" reference line RL conductor 250 is used to act as a common source line for the plurality of blocks. A row decoder 251(0), 251(1), . . . 251(N−1) and 251(N) is coupled to each block, for separately decoding the word lines WL and the reference select lines RSL(0) to RSL(N) on a block basis. As illustrated each block includes a single reference select line RSL. In some alternatives, more than one block can share a single reference select line.

Figure 8:
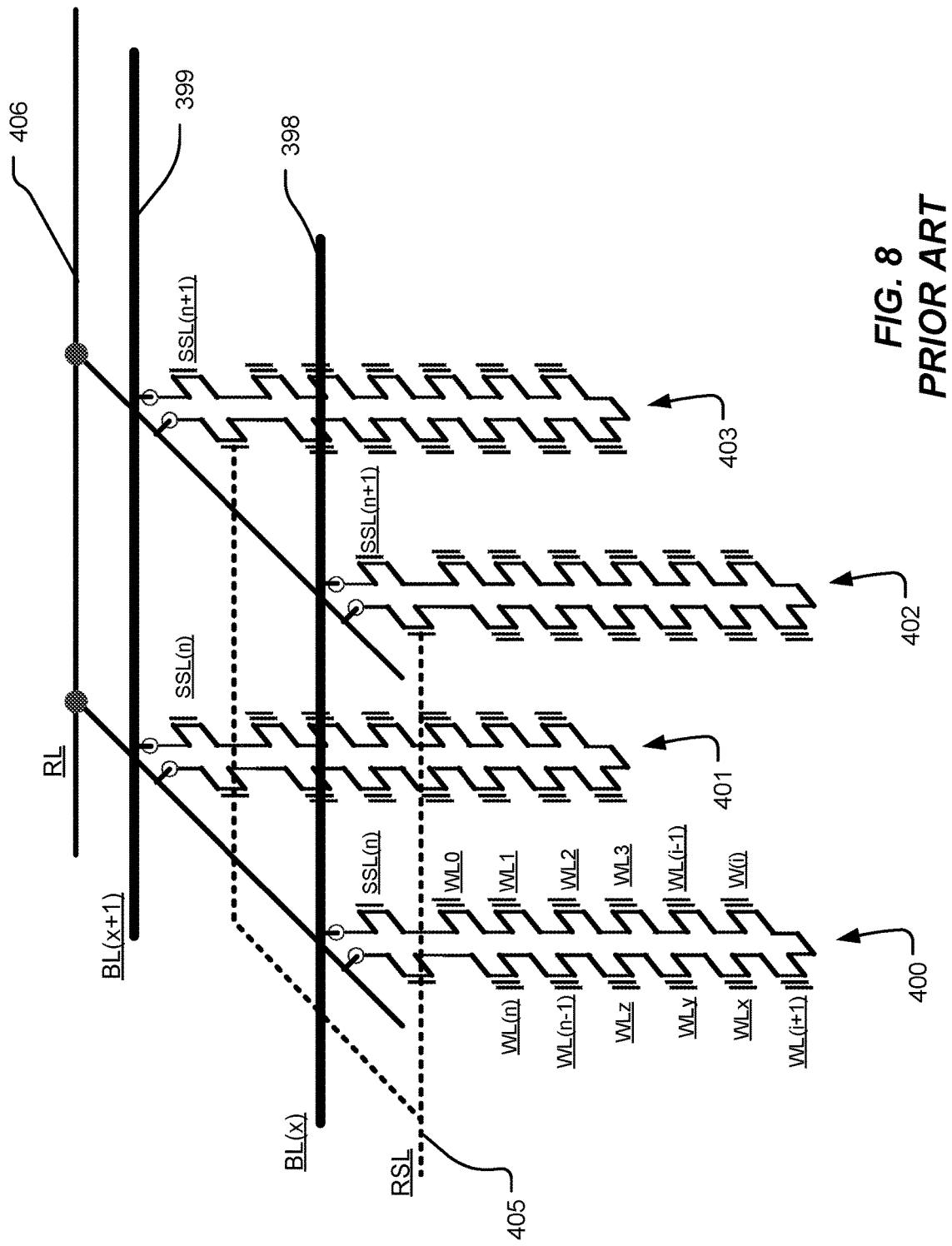
FIG. 8 is a schematic diagram of a portion of a block of U-shaped NAND strings which can be implemented as described with reference to FIGS. 1 and 2 having a single reference line.

FIG. 8 is a schematic diagram for a vertical NAND structure using the U-shaped NAND of FIG. 5, and configured as described with reference to FIG. 7 with a single block reference line RL 406 for the plurality of blocks. The schematic shows an array of four U-shaped NAND strings (400-403). All of the reference select switches in the array are coupled to a single RSL conductor 405. The NAND strings 400 and 402 are coupled by string select switches operably connected to the string select lines SSL(n) and SSL(n+1) and to the bit line BL(x) 398. The NAND strings 401 and 403 are coupled by string select switches operably connected to the string select lines SSL(n) and SSL(n+1) and to the bit line BL(x+1) 399.

According to this prior art structure represented by FIGS. 7 and 8, because the reference select lines are routed and decoded on a block basis, and a single reference line is provided to each block, biasing arrangements for erasing less than a full block are limited and complicated.

Figure 9:
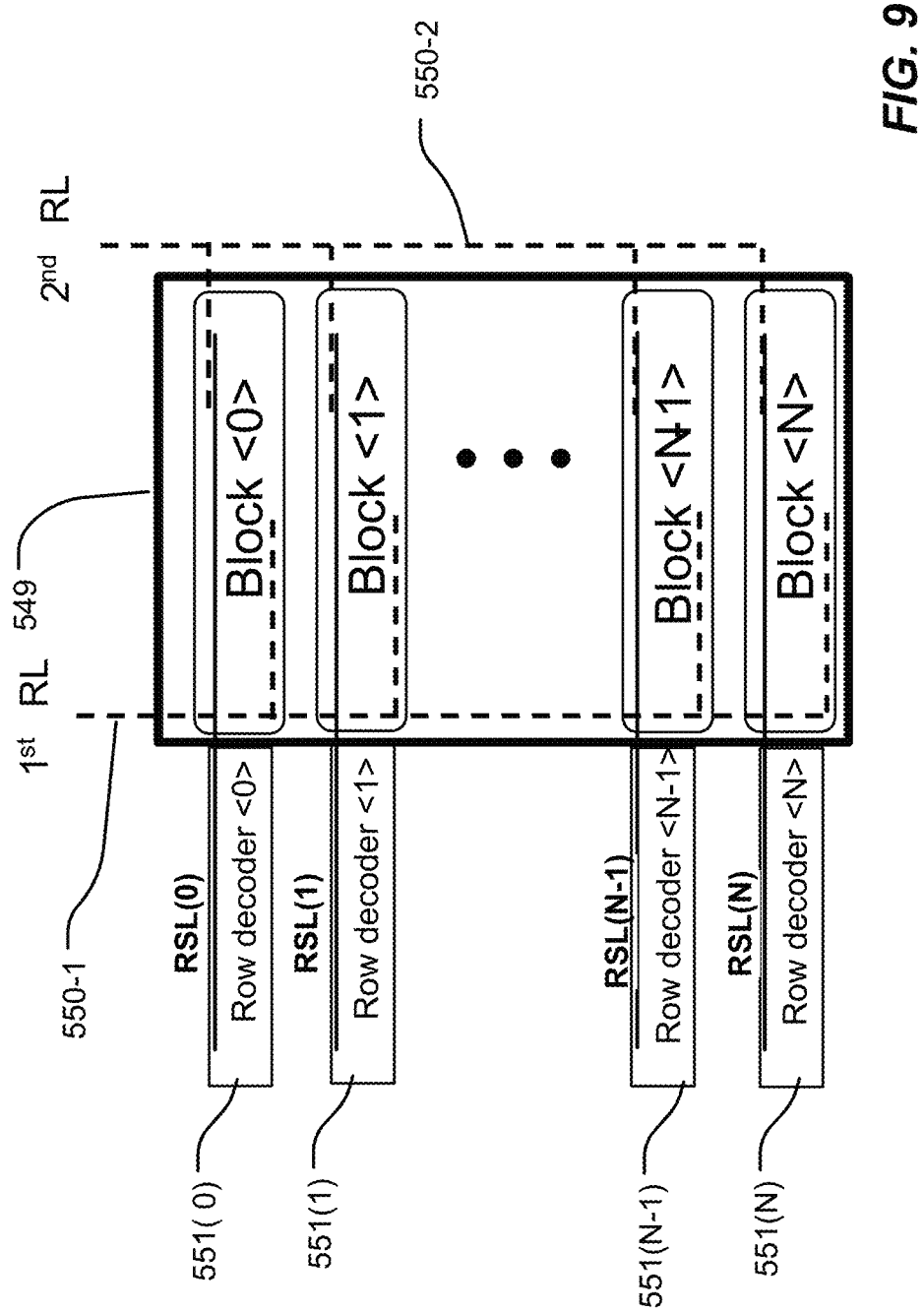
FIG. 9 is a simplified block diagram of a memory including a plurality of blocks, and two sub-block reference lines as described herein.

FIG. 9 is a simplified block diagram of a memory as described herein, configured for sub-block erase. The diagram in FIG. 9 includes memory 549 with a plurality of blocks Block<0> to Block<N>, which can be implemented using vertical channel 3D NAND strings. In this example, a first reference line 550-1 and a second reference line 550-2 are routed to each block. Row decoders 551(0), 551(1), . . . 551(N−1) and 551(N) are coupled to respective blocks, for separately decoding the word lines WL and the reference select lines RSL(0) to RSL(N) on a block basis. As illustrated, each block includes a single reference select line RSL. In some alternatives, more than one block share a single reference select line.

Figure 10:
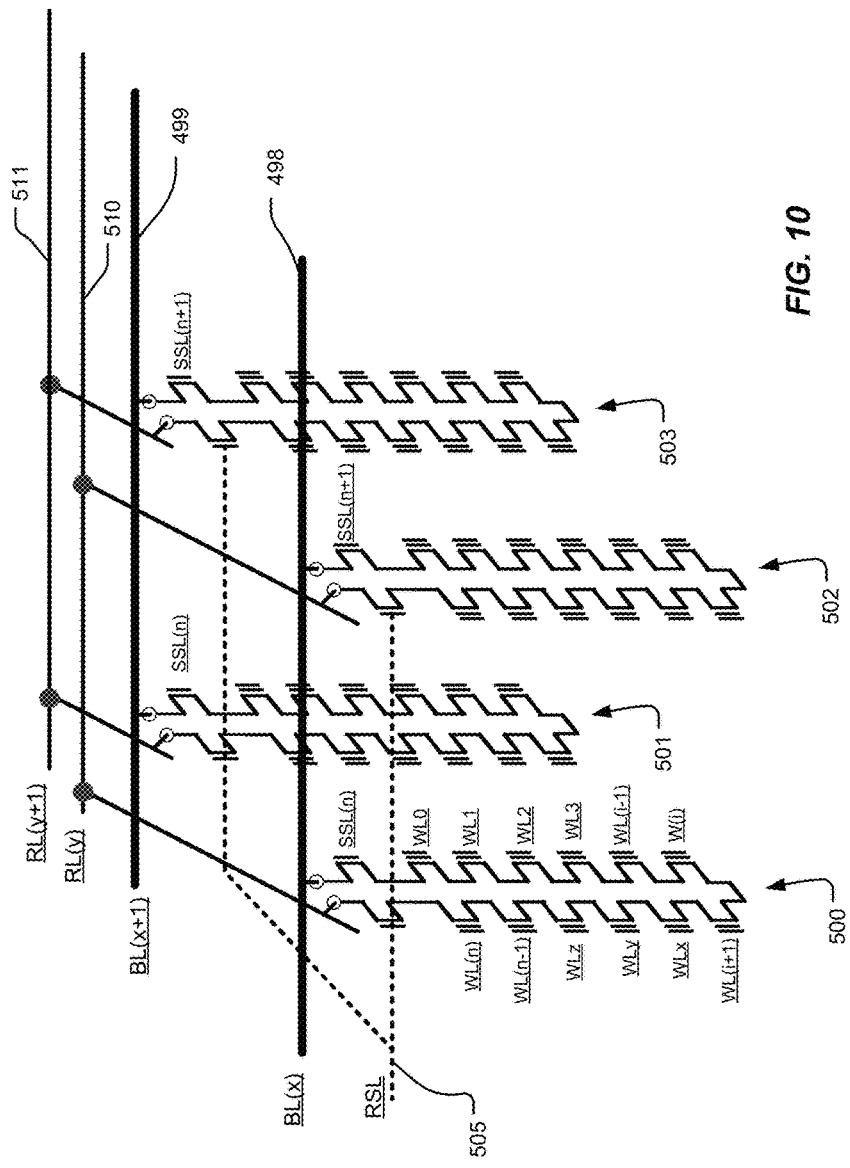
FIG. 10 is a schematic diagram of a portion of a block of U-shaped NAND strings which can be implemented as described with reference to FIGS. 1 and 2, having two sub-block reference lines for the block.

FIG. 10 is a schematic diagram for a vertical NAND structure using the U-shaped NAND strings of FIG. 5, and configured for sub-block erase. The schematic shows an array of four U-shaped NAND strings (500-503). All of the reference select switches in the array are coupled to a single reference select line RSL 505. The NAND strings 500 and 502 are coupled by string select switches operably connected to the string select lines SSL(n) and SSL(n+1) and to the bit line BL(x) 498. The NAND strings 501 and 503 are coupled by string select switches operably connected to the string select lines SSL(n) and SSL(n+1) and to the bit line BL(x+1) 499. The NAND strings 500 and 502 are coupled by reference select switches operably connected to the reference select line RSL 505 and to the sub-block reference line RL(y) 510. The NAND strings 501 and 503 are coupled by reference select switches operably connected to the reference select line RSL 505 and to the reference line RL(y+1) 511.

The structure of FIGS. 9 and 10 is configured for sub-block erase, in which the bias arrangement includes the same bias applied to the word lines, a set bias for the RSL line, the same bias applied the SSL lines and the same bias applied the word lines for the entire block, while the reference lines RL(y) and RL(y+1) receive different bias to achieve sub-block erase.

An erase bias arrangement which can be used for sub-block erase in the structures described herein is described with reference to FIGS. 11-13.

Figure 11:
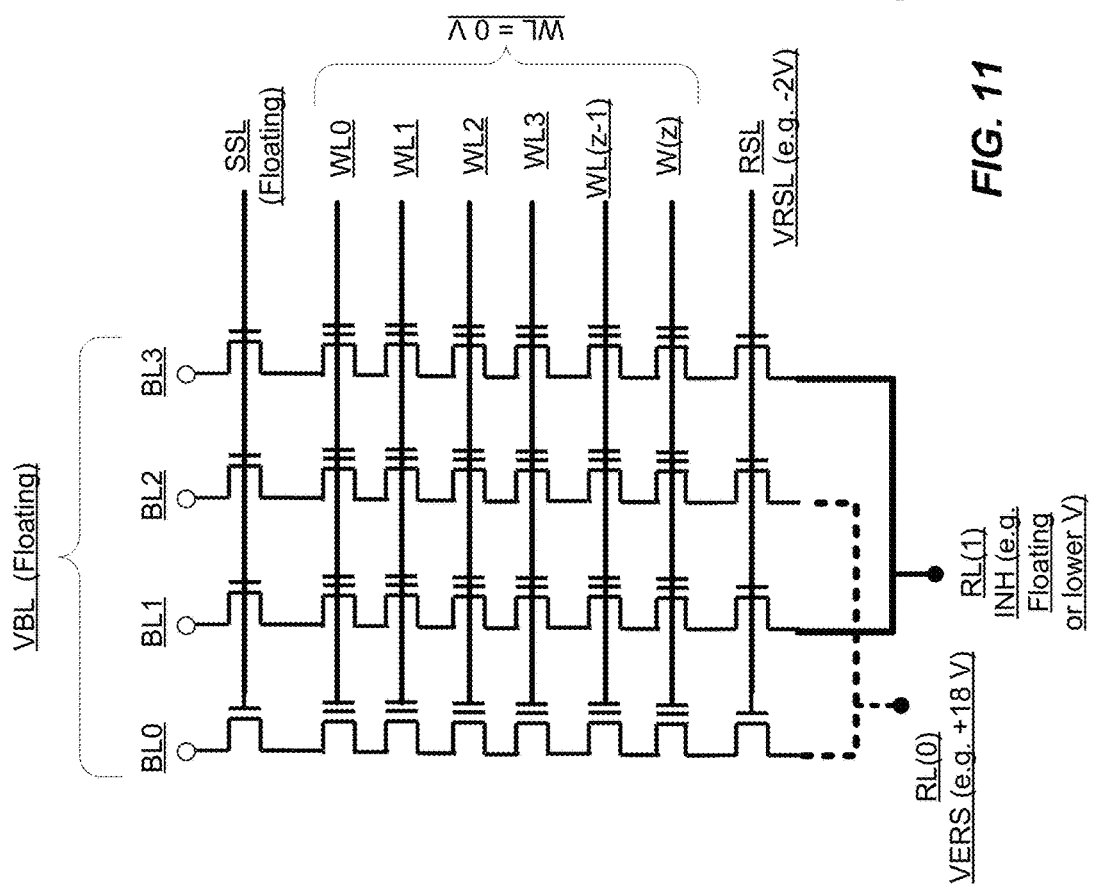
FIG. 11 is a schematic diagram of a slice of a block of NAND strings with two sub-block reference lines, which share a common string select line, labeled with a sub-block erase bias arrangement.

FIG. 11 is a schematic diagram of a slice of NAND strings in a block along a single string select line SSL, including four NAND strings which are coupled to corresponding bit lines BL0, BL1, BL2, BL3 by the string select switches. The NAND strings include a plurality of memory cells operably coupled to and sharing a single set of word lines WL0 to WL(z). The reference select switches for the four NAND strings are connected to a single reference select line RSL. A first sub-block of the NAND strings, including the NAND strings coupled to bit lines BL0 and BL2, are connected by the reference select switches to reference line RL(0), in response to a signal on the RSL line. A second sub-block of the NAND strings, including the NAND strings coupled to bit lines BL1 and BL3, are connected by the reference select switches to sub-block reference line RL(1), in response to a signal on the RSL line. A bias arrangement to cause gate induced drain leakage GIDL current in the NAND strings of a selected sub-block and inhibit gate induced drain leakage GIDL in unselected sub-blocks is shown. According to this bias arrangement, all the bit lines BL0 to BL3 are biased in a floating condition. All of the SSL lines, including the SSL line of this slice in the block, are biased in a floating condition. All of the word lines for the block are set to a reference voltage such as 0 V. The common RSL line for the block is set to a RSL voltage for the erase bias which in this example is −2 V. The sub-block reference line RL(0) of the selected sub-block receives an erase voltage VERS of for example +18 V. The sub-block reference line RL(1) of the unselected sub-block receives an inhibit bias, which can be a floating bias or a bias applying a voltage lower than the voltage applied to the sub-block reference line RL(0) of the selected sub-block. Thus, the erase bias arrangement applies the same bias to all of the bit lines, to all of the SSL lines, and to all of the word lines. The block has a single common RSL line. The sub-block erase bias arrangement includes applying a different bias to the selected sub-block reference line than is applied to the unselected sub-block reference line or lines.

Figure 12:
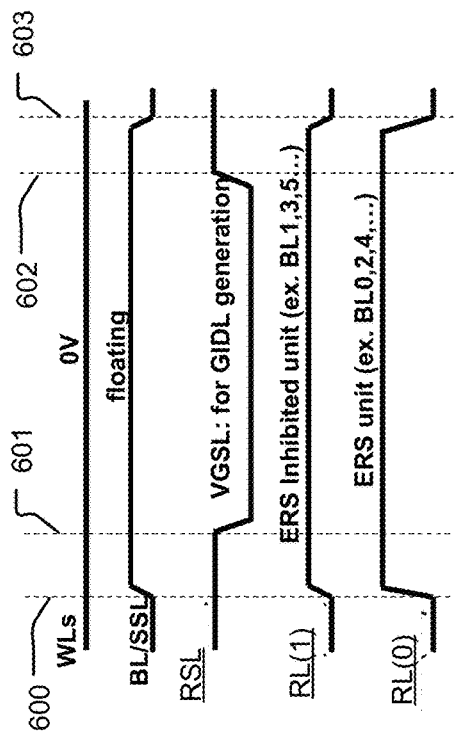
FIG. 12 is a timing diagram for an erase operation using the bias arrangement of FIG. 11.

FIG. 12 is a simplified timing diagram of a cycle in an erase operation that includes applying the erase bias arrangement described with respect to FIG. 11. An erase operation can included one or more cycles like that shown in FIG. 12, in which bias levels, pulse shapes and other parameters may be manipulated to complete a sub-block erase. The upper trace illustrates the voltage applied to the word lines WL. The next trace illustrates the bias applied to the bit lines BL and the string select lines SSL. The third trace illustrates the bias applied to the reference select line RSL for the block. The fourth trace illustrates the bias applied to the sub-block reference line RL(1). The fifth trace illustrates a bias applied to the sub-block reference line RL(0).

The erase operation in the simplified timing diagram begins prior to time 600 with the word lines, bit lines, SSL lines, RSL lines, and sub-block RL lines set to an initial level, such as ground. The command decoder and controller circuits can receive an erase command to erase a selected sub-block in a selected block. At time 600, the erase operation begins a set up operation, in which the bit lines and SSL lines are set to floating condition, the sub-block reference line RL(1) of the unselected sub-block is set to an erase inhibit level (floating or low voltage), and the sub-block reference line RL(0) of the selected sub-block is set to an erase voltage level (high positive voltage, such as +18 V). At time 601, the erase bias arrangement is applied by lowering the voltage on the reference select line RSL to a bias of for example −2 V, which in combination with the high-voltage on the sub-block reference line RL(0) of the selected sub-block, causes gate induced drain leakage GIDL in reference select transistor in the NAND strings in the selected sub-block (e.g. NAND strings on bit lines BL0 and BL2). The bias arrangement of the reference select line and the sub-block reference line RL(1) of the unselected sub-blocks inhibits gate induced drain leakage in the NAND strings of the unselected sub-block (e.g. NAND strings on bit lines BL1 and BL3). At time 602, the RSL line returns to a ground or neutral level. At time 603, the erase cycle in finished, and the device may execute erase verify or other following steps in the erase operation.

Figure 13:
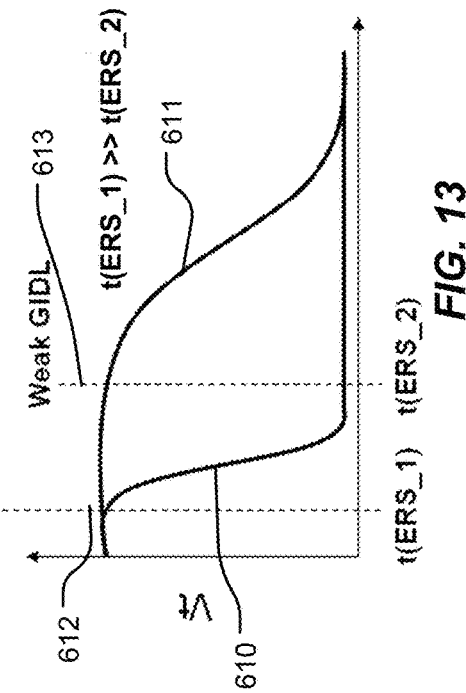
FIG. 13 is a graph of threshold voltage versus time illustrating the effect of the erase operation described with reference to FIGS. 11 and 12.

FIG. 13 is a graph of threshold voltage versus time under the erase bias condition shown in FIG. 12. The graph includes a first trace 610, and a second trace 611. The first trace 610 illustrates threshold voltage change with time in the selected sub-block, while the second trace 611 illustrates the threshold voltage change with time in the unselected sub-block. In a reference select switch having a high voltage, such as positive 18 V applied to its drain, and a low voltage, such as −2 V applied to its gate, gate induced drain leakage current from the reference select switch injects charge carriers into the NAND strings. An electric field is established between the channel lines in the NAND string and the word line voltages which induces hole tunneling to reduce the threshold voltage of the cells. In the selected sub-block, the gate induced drain leakage current is substantial, and the threshold voltage begins to fall rapidly at time t(ERS1) 612. The voltage on the sub-block reference line of the unselected sub-block is significantly lower than that applied to the sub-block reference line of the selected sub-block. Therefore, the gate induced drain leakage current will be very weak and insufficient to induce charge tunneling until for example time t(ERS2) 613, after which a slow threshold drop may occur. By biasing the unselected sub-block reference line so that t(ERS2) is much greater than the time between times at 601 and 602 in FIG. 12, gate induced drain leakage current is inhibited in the unselected sub-blocks. Thus, an unselected sub-block is given an erase inhibit bias.

Figure 14:
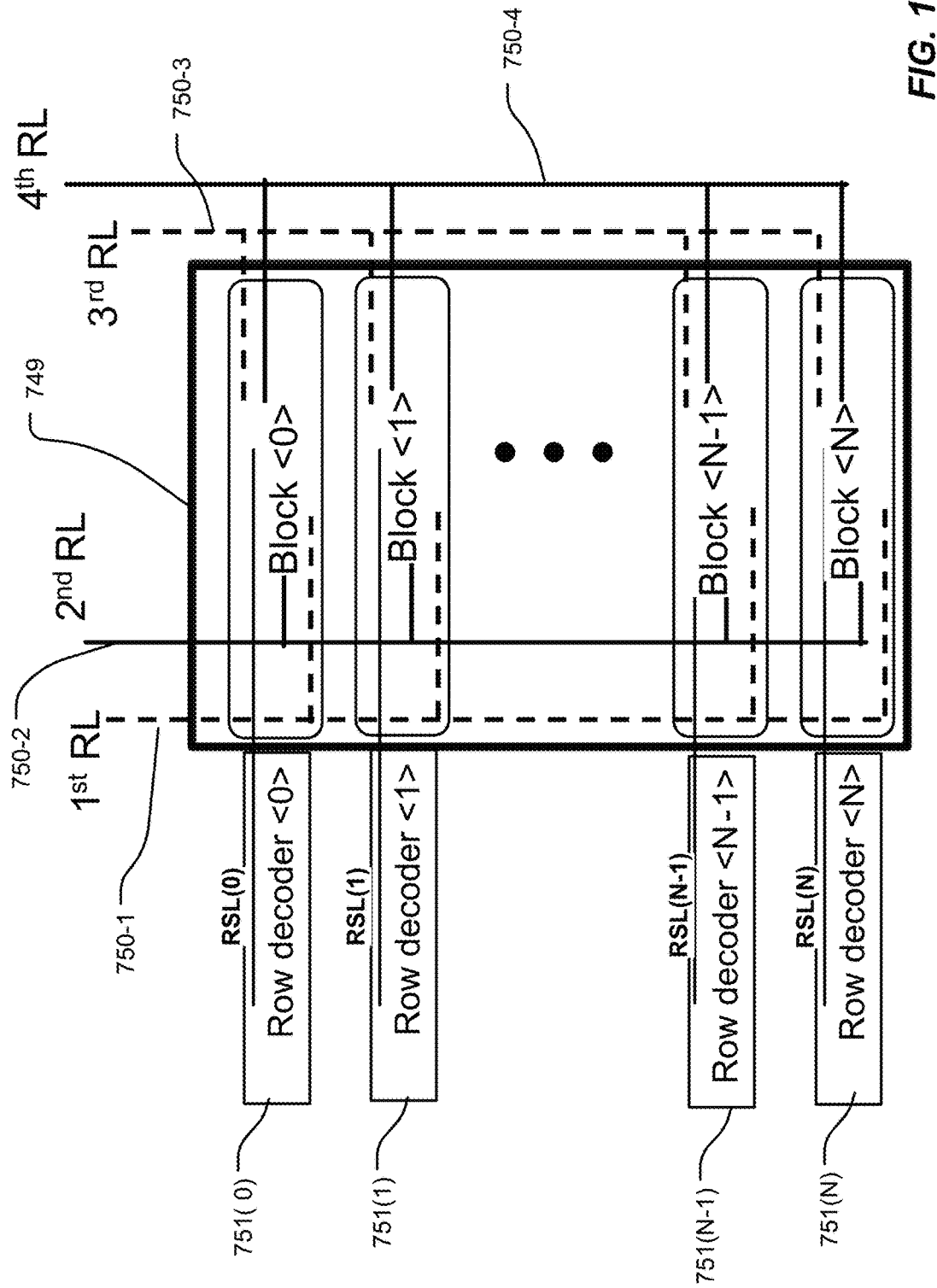
FIG. 14 is a simplified block diagram of a memory including a plurality of blocks, and four sub-block reference lines as described herein.

FIG. 14 is a simplified block diagram of a memory as described herein, configured for sub-block erase supporting four sub-blocks per block. The diagram in FIG. 14 includes memory 749 with a plurality of blocks Block<0> to Block<N>, which can be implemented using vertical channel 3D NAND strings. In this example, a first reference line 750-1, a second reference line 750-2, a third reference line 750-3 and a fourth reference line 750-4 are routed to each block. Row decoders 751(0), 751(1), . . . 751(N−1) and 751(N) are coupled to corresponding blocks, for separately decoding the word lines WL and the reference select lines RSL(0) to RSL(N) on a block basis. As illustrated each block includes a single reference select line RSL. In some alternatives, more than one block share a single reference select line.

Figure 15:
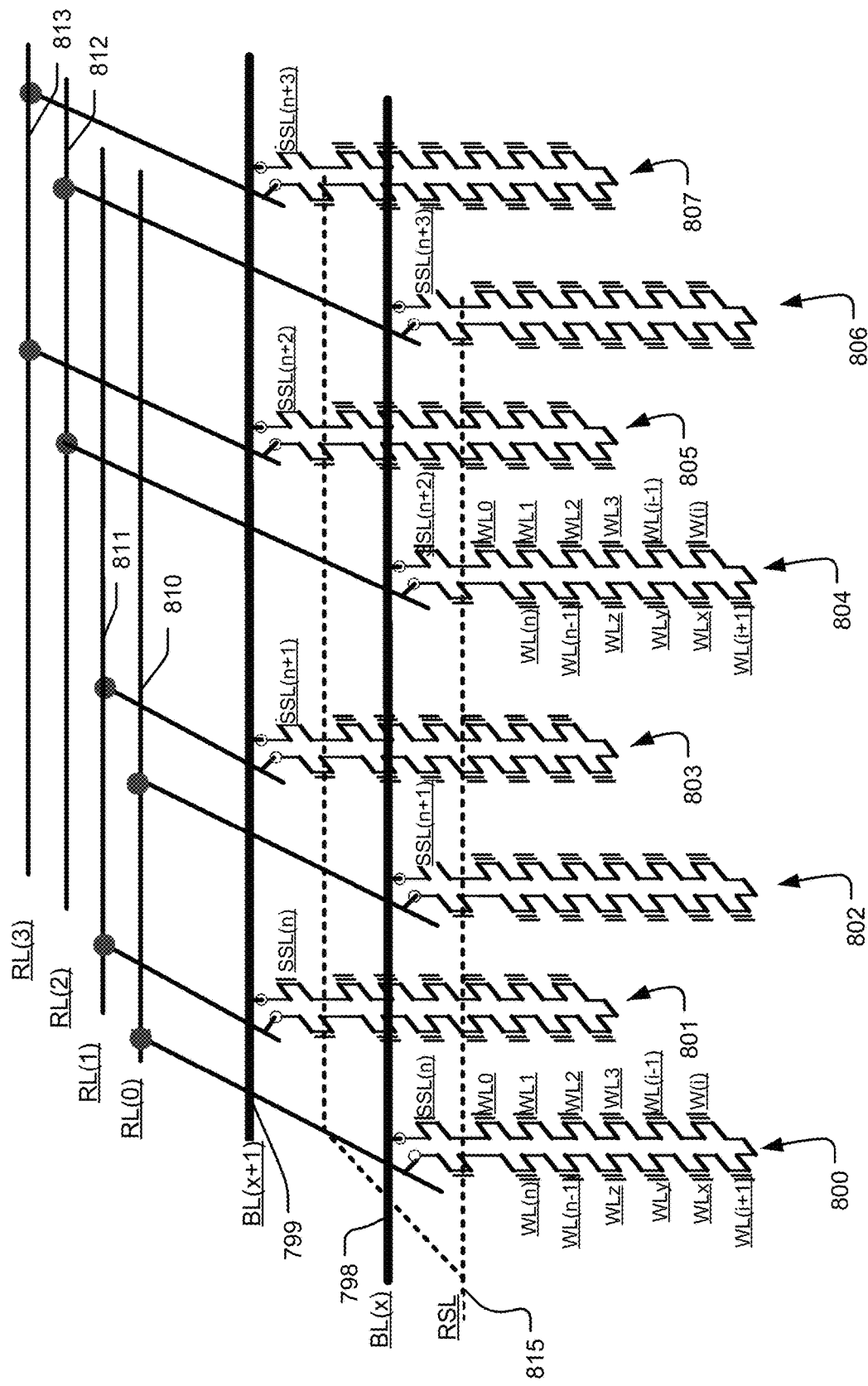
FIG. 15 is a schematic diagram of a portion of a block of U-shaped NAND strings which can be implemented as described with reference to FIGS. 1 and 2, having four sub-block reference lines for the block.

FIG. 15 is a schematic diagram for a vertical NAND structure using the U-shaped NAND strings of FIG. 5, and configured for sub-block erase having four sub-block reference lines, supporting four sub-blocks per block. The schematic shows an array of eight U-shaped NAND strings (800-807). All of the reference select switches in the array are coupled to a single RSL conductor 815. The NAND strings 800, 802, 804, 806 are coupled by string select switches operably connected to respective string select lines SSL(n), SSL(n+1), SSL(n+2) and SSL(n+3) and to the bit line BL(x) 798. The NAND strings 801, 803, 805, 807 are coupled by string select switches operably connected to respective string select lines SSL(n), SSL(n+1), SSL(n+2) and SSL(n+3) and to the bit line BL(x+1) 799. The NAND strings 800 and 802 are coupled by reference select switches operably connected to the reference select line RSL and to the reference line RL(0) 810. The NAND strings 801 and 803 are coupled by reference select switches operably connected to the reference select line RSL and to the reference line RL(1) 811. The NAND strings 804 and 806 are coupled by reference select switches operably connected to the reference select line RSL and to the reference line RL(2) 812. The NAND strings 805 and 807 are coupled by reference select switches operably connected to the reference select line RSL and to the reference line RL(3) 813.

The structure of FIG. 15 is configured for sub-block erase, in which the bias applied to the word lines, the RSL line and the SSL lines is the same for the entire block, while the reference lines RL(0) to RL(3) receive different bias to erase a selected sub-block in a selected block, while inhibiting erasing in unselected sub-blocks.

The number of sub-blocks configured for a particular implementation is a design choice that depends on the routing resources available for the design.

Figure 16:
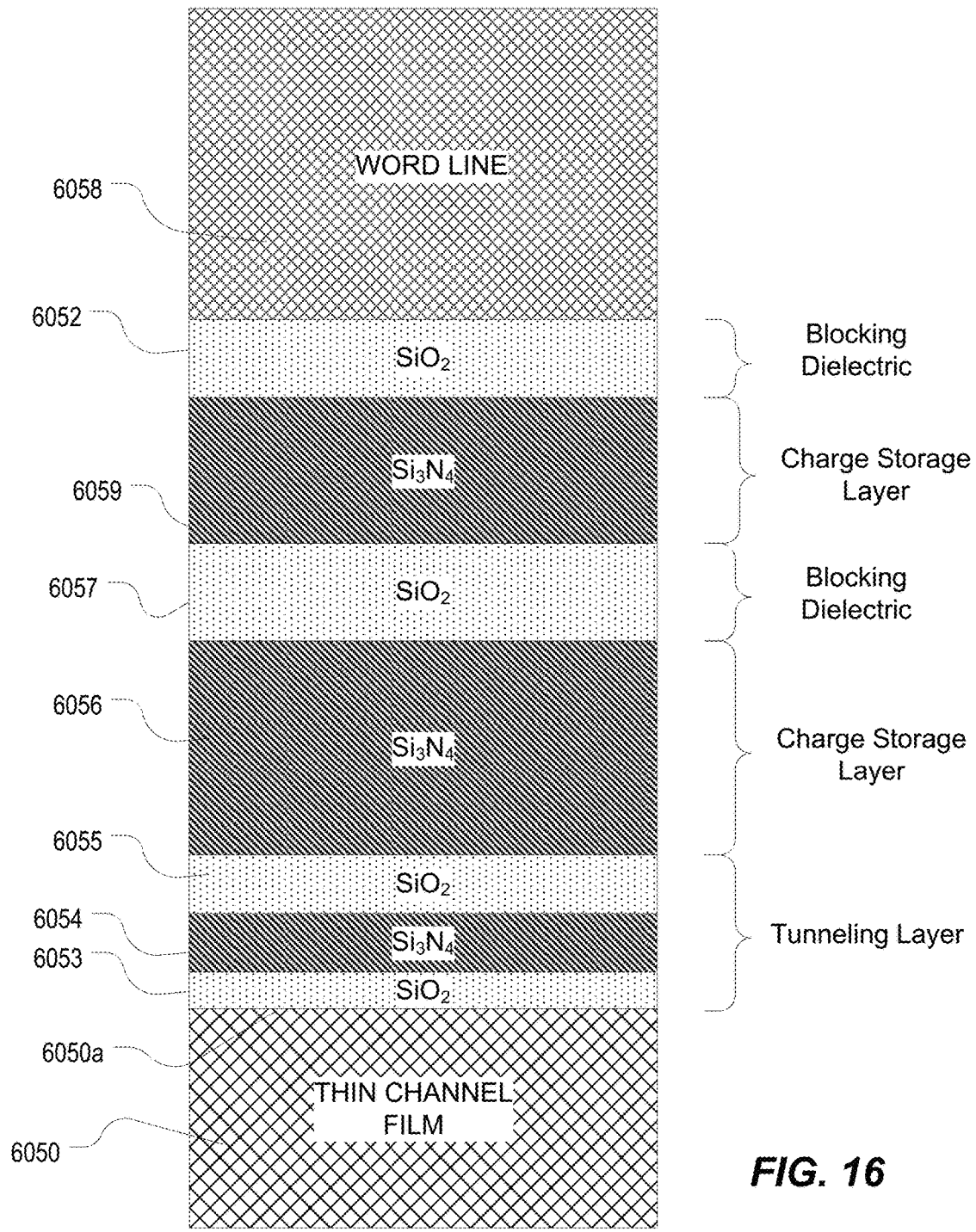
FIG. 16 illustrates one type of data storage structure which can be utilized in 3D NAND memory as described herein.

FIG. 16 is a simplified diagram of an improved BE-SONOS dielectric charge storage layer that can be utilized in the structure described herein, supporting hole tunneling for erase relying on gate induced drain leakage current for selected sub-blocks.

The dielectric charge trapping structure includes a tunneling layer in contact with the vertical channel structure 6050, comprises a composite of materials including a first tunneling layer 6053 of silicon oxide, a tunneling layer 6054 of silicon nitride, and a second tunneling layer 6055 of silicon oxide.

The first tunneling layer 6053 of silicon dioxide on the surface 6050a of the channel structure 6050 is formed for example using in-situ steam generation ISSG with optional nitridation by either a post deposition NO anneal or by addition of NO to the ambient during deposition. The thickness of the first tunneling layer 6053 of silicon dioxide is less than 20 Å, and preferably 7-15 Å. The first tunneling layer 6053 can be engineered with alternatives such as nitrided oxide for improved endurance, and/or fluorine treatments for improved interface state quality.

The tunneling layer of silicon nitride 6054, also referred to as a tunneling nitride layer, lies on the first tunneling layer 6053 of silicon oxide formed for example using low-pressure chemical vapor deposition LPCVD, using for example dichlorosilane DCS and $NH_3$ precursors at 680 degrees C. In alternative processes, the tunneling nitride layer comprises silicon oxynitride, made using a similar process with an $N_2O$ precursor. The thickness of the layer 6054 of silicon nitride is less than 30 Å, and preferably 10-30 Å, including for example 20 Å. Because of its thinness, layer 6054 is poor at storing charge.

Layer 6054 provides a low hole barrier height to facilitate hole injection for erasing. However, layer 6054 has a low trapping efficiency. Various materials for layer 6054, along with their valence band offsets with silicon are: $SiO_2$ 4.4 eV, $Si_3N_4$ 1.8 eV, $Ta_2O_5$ 3.0 eV, $BaTiO_3$ 2.3 eV, $BaZrO_3$ 3.4 eV, $ZrO_2$ 3.3 eV, $HfO_2$ 3.4 eV, $Al_2O_3$ 4.9 eV, $Y_2O_3$ 3.6 eV, $ZrSiO_4$ 3.4 eV. $Si_3N_4$ has the lowest hole barrier height with 1.8 eV, although other materials are possible.

The second tunneling layer 6055 of silicon dioxide lies on the tunneling layer 6054 of silicon nitride and is formed for example using LPCVD high temperature oxide HTO deposition. The thickness of the second tunneling layer 6055 of silicon dioxide is less than 45 Å, and preferably 15-45 Å, for example 30 Å. The second tunneling layer 6055 provides sufficient barrier thickness to block charge loss for improved charge retention. The second tunneling layer 6055 blocks direct tunneling leakage. Other low leakage oxides such as $Al_2O_3$ are possible.

A first charge storage layer 6056 in this embodiment comprises silicon nitride having a thickness greater than 45 Å, and preferably 45-80 Å, including for example about 55 Å in this embodiment formed for example using LPCVD. Other charge trapping materials and structures may be employed, including for example silicon oxynitride ($Si_xO_yN_z$), silicon-rich nitride, silicon-rich oxide, trapping layers including embedded nanoparticles and so on. A variety of charge trapping materials is described in the above referenced U.S. Patent Application Publication No. 2006/0261401 A1, entitled "Novel Low Power Non-Volatile Memory and Gate Stack," by Bhattacharyya, published 23 Nov. 2006, now U.S. Pat. No. 7,612,403. High charge trapping efficiency alternatives are oxynitride, silicon-rich nitride, embedded nanoparticles, and $HfO_2$.

A first blocking layer 6057 of silicon dioxide lies on the first charge storage layer 6056 and is formed for example using LPCVD high temperature oxide HTO deposition. The thickness of the first blocking layer 6057 of silicon dioxide is less than 70 Å, including for example a range of 55-70 Å, including for example 50 Å. The first blocking layer 6057 provides sufficient barrier thickness to block charge mixing and charge transport between the charge storage layers 6056 and 6059. Other low leakage oxides such as $Al_2O_3$ are possible.

A second charge storage layer 6059 in this embodiment comprises silicon nitride having a thickness greater than 30 Å, including for example a range of 30-60 Å, including for example about 40 Å in this embodiment formed for example using LPCVD. Other embodiments are similar to the first charge trapping layer. The second charge storage layer 6059 traps electrons during —FN erasing to stop gate electron injection, allowing continuous erase of first charge storage layer 6056 by channel hole injection. High charge trapping efficiency alternatives are oxynitride, silicon-rich nitride, embedded nanoparticles, and $HfO_2$.

A second blocking layer 6052 of silicon dioxide lies on the second charge storage layer 6059 and is formed for example using LPCVD high temperature oxide HTO deposition. The thickness of the second blocking layer 6052 of silicon dioxide is less than 60 Å, including for example a range of 30-60 Å, including for example 35 Å.

Finally, the second blocking layer 6052 is disposed on a layer 6058 of gate material, such as a thin-film semiconductor layer configured as a semiconductor strip.

Figure 17:
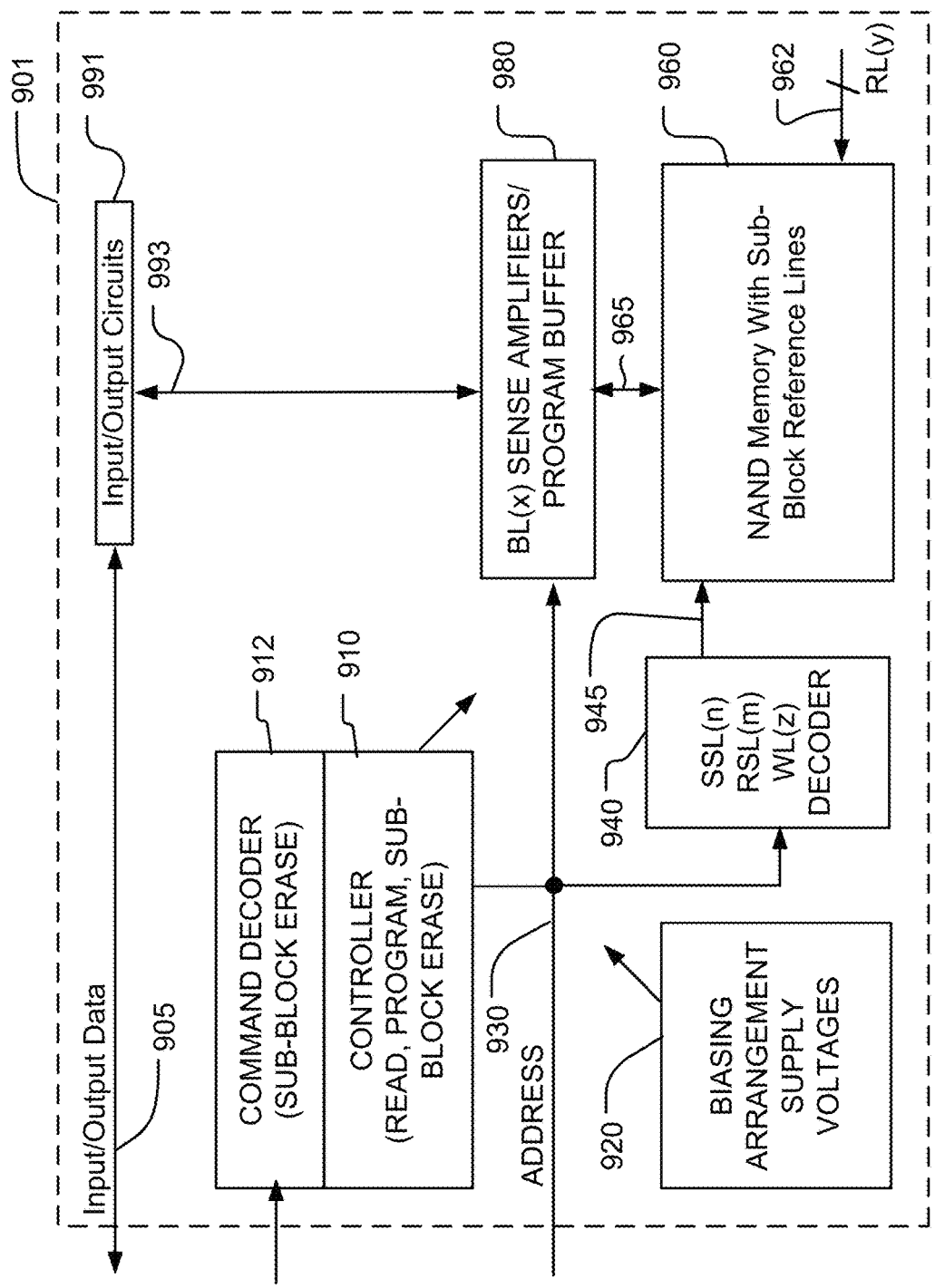
FIG. 17 is a block diagram of an integrated circuit memory including a 3D memory array configured for sub-block erase.

FIG. 17 is a simplified chip block diagram of an integrated circuit 901 including a 3D vertical NAND array including sub-block reference lines configured for sub-block erase as described above. The integrated circuit 901 includes a memory array 960 including a plurality of memory blocks as described herein with for example U-shaped NAND strings comprising vertical channel cells on an integrated circuit substrate.

An SSL/RSL/WL decoder 940 is coupled to a plurality of SSL(n)/RSL(m)/WL(z) lines 945, arranged in the memory array 960 for applying bias conditions (e.g. positive voltages, negative voltages, floating conditions, controlled current) to the lines in each block in the array. There can be a number N SSL lines (SSL(n)), one SSL line for NAND strings in a logical column of NAND strings in an array that is configured to one bit line per NAND string, so that the NAND strings in the column are connected in parallel to separate bit lines. There can be a number Z word lines (WL(z)), one word line WL for the memory cells in a block that are disposed in a single level in an independent double gate NAND, or two word lines for the memory cells in a block that are disposed in a single level in a U-shaped NAND. There can be a number M of reference select lines RSL(m), one or more blocks being coupled to one reference select line. There can be a number Y sub-block reference lines RL(y), which are routed to a plurality of blocks in the array. Sense amplifier and program buffer circuits 980 are coupled to the array 960, in this example via bit lines BL(x) 965. Addresses are supplied on bus 930 from controller 910 to decoder 940. A plurality of sub-block reference lines RL(y) are routed as indicated at line 962 within the array 960 as discussed above.

Sensed data from the sense amplifier/program buffer circuits are supplied via data lines 993 to input/output circuits 991 that drive the data to destinations external to the integrated circuit 901. Input/output data and control signals are moved via data bus 905 between the input/output circuits 991, the controller 910 and input/output ports on the integrated circuit 901 or other data sources internal or external to the integrated circuit 901, such as a general purpose processor or special purpose application circuitry, or a combination of modules providing system-on-a-chip functionality supported by the memory array 960.

In the example shown in FIG. 27, controller 910 is coupled with a command decoder 912 that can interpret a command to perform a sub-block erase in a selected block. In response to the command, the controller can execute an erase operation, including the application of biasing arrangements using supply voltages generated or provided through the voltage supply or supplies in block 920, such as read, sub-block erase, block erase, verify and program bias voltages.

In embodiments supporting the NAND structures described herein, the logic is configured to perform the method of:

executing an erase operation in response to a command to erase a selected sub-block in a selected block, the erase operation including applying in erase biasing arrangement, including (1) a first bias on reference select line coupled to all of the NAND strings in a set of Y sub-blocks in the selected block, (2) a second bias on a selected one of Y reference lines in the selected block to induce GIDL in the NAND strings of the selected sub-block and (3) a third bias on at least one unselected reference line of the Y reference lines to inhibit GIDL in the NAND strings of an unselected sub-block in the set of Y sub-blocks of the selected block.

The erase bias arrangement can include a common bias to the word lines WL(z) in the selected block.

The erase bias arrangement can include floating bit lines BL(x) in a set of X bit lines coupled to the selected and unselected sub-blocks in the selected block, and floating the string select lines SSL(n) in a set of N string select lines coupled to the selected and unselected sub-blocks in the selected block.

The erase bias arrangement can be configured to induce hole tunneling to erase the memory cells in the selected sub-block.

In embodiments supporting the U-shaped vertical NAND structures described herein, the logic is configured to perform the method of:

selecting a layer of memory cells in the array, such as using a word line layer decoder;

selecting a side of the vertical channel structures in the selected layer such as by selecting an even or odd side word line structure;

selecting vertical channel structures in a selected row in the array such as by using SSL switches and RSL switches on the rows of vertical channel structures; and storing charge in charge trapping sites in the selected layer on the selected side of vertical channel structures in one or more selected columns in the array, to represent data using bit line circuitry like page buffers on global bit lines coupled to the selected row of vertical channel structures.

In some embodiments, the logic is configured to select a layer and select a side by selecting one of even and odd interdigitated word line structures in the selected layer of the array, such as by controlling even and odd word line layer decoders.

In some embodiments, the logic is configured to store multiple levels of charge to represent more than one bit of data in the charge trapping sites in the selected layer on the selected side. In this manner, a selected cell in a selected frustum of a vertical channel structure in the array stores more than two bits, including more than one bit on each side of the cell.

The controller 910 can be implemented using special-purpose logic circuitry including state machines as known in the art. In alternative embodiments, the controller 910 comprises a general-purpose processor, which can be implemented on the same integrated circuit, which executes a computer program to implement state machines that control the operations of the device. In yet other embodiments, a combination of special-purpose logic circuitry and a general-purpose processor can be utilized for implementation of the control logic.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A memory device, comprising:
a plurality of blocks of memory cells, bit lines, word lines and sub-block reference lines;
each block in the plurality being operably coupled to a set of X bit lines BL(x), a set of Z word lines WL(z), and a set of Y sub-block reference lines RL(y), where Y is two or more, and each block including:
an array of NAND strings including a plurality of rows and a plurality of columns of NAND strings, each NAND string in the array including memory cells coupled to each word line WL(z) in the set of Z word lines, the NAND strings in the array having respective first select switches and second select switches;
a string select line set including N string select lines coupled to gates of the first select switches of NAND strings in corresponding columns of the NAND strings in the array, each string select line SSL(n) in the string select line set configured to control the first switches in one column of the NAND strings in the array for selective connection to corresponding bit lines BL(x) in the set of X bit lines;

a reference select line RSL coupled to gates of the second select switches of all the NAND strings in the array, the reference select line RSL configured to control the second switches in the array for connection of NAND strings in Y sub-blocks of the array to corresponding reference lines RL(y) in the set of Y sub-block reference lines, the NAND strings in a same row connected to two or more reference lines RL(y) in the set of Y sub-block reference lines; and a controller and bias circuitry coupled to the plurality of blocks, responsive to a command to erase a selected sub-block in a selected block, to apply an erase bias arrangement including a first bias on the reference select line of the selected block, a second bias on a selected one of the Y sub-block reference lines to induce erase current in the selected sub-block, and a third bias on at least one unselected reference line of the Y sub-block reference lines to inhibit erase current in the NAND strings of one or more unselected sub-block in the selected block.

2. The memory device of claim 1, wherein the NAND strings are disposed vertically with a plurality of word line levels, one word line for each NAND string in each word line level, the string select lines in an upper level above the word line levels, and the reference select line in a lower level below the word line levels.

3. The memory device of claim 1, wherein the NAND strings are disposed vertically in a U-shape, with a plurality of word line levels, two word lines for each NAND string in each word line level, the string select lines in an upper level above the word line levels, and the reference select line in said upper level.

4. The memory device of claim 1, wherein the second bias on a selected one of the Y sub-block reference lines is set to cause gate induced drain leakage GIDL current as said erase current in the NAND strings of the selected sub-block.

5. The memory device of claim 1, the erase bias arrangement including a common bias to the word lines WL(z) in the set of Z word lines.

6. The memory device of claim 1, the erase bias arrangement including floating the bit lines BL(x) in the set of X bit lines, and floating the string select lines SSL(n) in the set of N string select lines.

7. The memory device of claim 1, the erase bias arrangement configured to induce hole tunneling to erase the memory cells in the selected sub-block.

8. A memory device, comprising:

a plurality of blocks of memory cells, each block in the plurality being operably coupled to a set of X bit lines BL(x), a set of Z word lines WL(z), and a set of Y sub-block reference lines RL(y), where Y is two or more, and each block including:

a plurality of stacks of conductive strips, the plurality of stacks including even stacks and odd stacks;

a plurality of active pillars arranged between corresponding even and odd stacks of conductive strips in the plurality of stacks, active pillars in the plurality comprising even and odd vertical channel films having outside surfaces and inside surfaces, defining a multi-layer array of interface regions at crosspoints between outside surfaces of the even and odd vertical channel films and conductive strips in the corresponding even and odd stacks of conductive strips, the even and odd vertical channel films are connected to form a current path from an upper end to a lower end of the even vertical channel film, and from a lower end to an upper end of the odd vertical channel film;

a 3D array of NAND strings including a plurality of rows and a plurality of columns of NAND strings and including even memory cells in the interface regions accessible via the active pillars and conductive strips in the even stacks of conductive strips and odd memory cells in the interface regions accessible via the active pillars and conductive strips in the odd stacks of conductive strips, wherein the even and odd memory cells on a given active pillar are connected in series as a single NAND string;

conductive strips in an upper level in the even stacks being configured as a string select line set including N string select lines, each string select line SSL(n) in the string select line set configured to control string select switches in one column of the NAND strings in the array for selective connection to corresponding bit lines BL(x) in a set of X bit lines;

conductive strips in an upper level in the odd stacks being configured as a common reference select line RSL configured to control reference select switches in all the NAND strings in the array, for connection of NAND strings in Y sub-blocks of the array to corresponding reference lines RL(y) in the set of Y sub-block reference lines, the NAND strings in a same row connected to two or more reference lines RL(y) in the set of Y sub-block reference lines;

conductive strips in intermediate levels in the even and odd stacks being configured as word lines for the NAND string on a given active pillar, and a controller and bias circuitry coupled to the plurality of blocks, responsive to a command to erase a selected sub-block in a selected block, to apply an erase bias arrangement including a first bias on the reference select line of the selected block, a second bias on a selected one of the Y sub-block reference lines to induce erase current in the selected sub-block, and a third bias on at least one unselected reference line of the Y sub-block reference lines to inhibit erase current in the NAND strings of one or more unselected sub-block in the selected block.

9. The memory device of claim 8, including one or more patterned conductor layers over the plurality of stacks, including said bit lines and said reference lines, and interlayer connectors connecting the bit lines to corresponding even vertical channel films and connecting said reference lines to corresponding odd vertical channel films.

10. The memory device of claim 8, wherein in a given block, conductive strips in a given layer of an odd stack are configured in a comb-like structure with strips extending from an odd pad, and conductive strips in the given layer of an even stack are configured in a comb-like structure with strips extending from an even pad, the conductive strips extending from the odd and even pads in the given block being interdigitated.

11. The memory device of claim 8, wherein the memory cells comprise charge storage structures.

12. The memory device of claim 8, wherein the second bias on a selected one of the Y sub-block reference lines is set to cause gate induced drain leakage GIDL current as said erase current in the NAND strings of the selected sub-block.

13. The memory device of claim 12, the erase bias arrangement including a common bias to the word lines WL(z) in the set of Z word lines.

14. The memory device of claim 13, the erase bias arrangement including floating the bit lines BL(x) in the set of X bit lines, and floating the string select lines SSL(n) in the set of N string select lines.

15. The memory device of claim 8, the erase bias arrangement configured to induce hole tunneling to erase the memory cells in the selected sub-block.

16. A method for erasing a selected sub-block in a block of NAND strings in a NAND memory device, the block of NAND strings, comprising:
 executing an erase operation in response to a command to erase a selected sub-block in a selected block, the erase operation including applying an erase biasing arrangement, including:
 a first bias on reference select line coupled to all of the NAND strings in a set of Y sub-blocks in the selected block;
 a second bias on a selected one of Y sub-block reference lines in the selected block to cause gate induced drain leakage GIDL in the NAND strings of the selected sub-block; and
 a third bias on at least one unselected reference line of the Y sub-block reference lines to inhibit GIDL in the NAND strings of an unselected sub-block in the set of Y sub-blocks of the selected block.

17. The method of claim 16, wherein the erase bias arrangement includes a common bias to the word lines WL(z) in the selected block.

18. The method of claim 16, wherein the erase bias arrangement includes floating bit lines BL(x) in a set of X bit lines coupled to the selected and unselected sub-blocks in the selected block, and floating the string select lines SSL(n) in a set of N string select lines coupled to the selected and unselected sub-blocks in the selected block.

19. The method of claim 16, wherein the erase bias arrangement is configured to induce hole tunneling to erase the memory cells in the selected sub-block.

\* \* \* \* \*